(12) United States Patent
Zong et al.

(10) Patent No.: US 12,033,554 B2
(45) Date of Patent: Jul. 9, 2024

(54) SHIFT REGISTER IN DISPLAY, GATE DRIVE CIRCUIT, DISPLAY DEVICE, AND DRIVING METHOD FOR SAME

(71) Applicant: BOE Technology Group Co., Ltd., Beijing (CN)

(72) Inventors: Shaolei Zong, Beijing (CN); Jigang Sun, Beijing (CN); Chingwen Kung, Beijing (CN); Wei Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/627,143

(22) PCT Filed: Apr. 12, 2021

(86) PCT No.: PCT/CN2021/086514
§ 371 (c)(1),
(2) Date: Jan. 14, 2022

(87) PCT Pub. No.: WO2021/227737
PCT Pub. Date: Nov. 18, 2021

(65) Prior Publication Data
US 2022/0270532 A1 Aug. 25, 2022

(30) Foreign Application Priority Data
May 14, 2020 (CN) .......................... 202010407362.8

(51) Int. Cl.
*G11C 19/28* (2006.01)
*G09G 3/20* (2006.01)
*G09G 3/36* (2006.01)

(52) U.S. Cl.
CPC ............... *G09G 3/20* (2013.01); *G11C 19/28* (2013.01); *G09G 3/2092* (2013.01);
(Continued)

(58) Field of Classification Search
CPC ........ G11C 19/28; G09G 3/20; G09G 3/2092; G09G 3/3674; G09G 3/3677;
(Continued)

(56) References Cited

U.S. PATENT DOCUMENTS

2011/0032231 A1* 2/2011 Maruyama ........... G09G 3/2096
345/208
2013/0293529 A1* 11/2013 You ......................... G09G 3/20
345/212
(Continued)

FOREIGN PATENT DOCUMENTS

CN 107248401 A 10/2017
CN 109166600 A 1/2019
(Continued)

OTHER PUBLICATIONS

International Search Report for PCT/CN2021/086514 dated Jul. 12, 2021.
(Continued)

*Primary Examiner* — Adam J Snyder
(74) *Attorney, Agent, or Firm* — Ling Wu; Stephen Yang; Ling and Yang Intellectual Property

(57) ABSTRACT

A shift register, a gate drive circuit, a display device, and a driving method for the same. The shift register comprises a first output sub-circuit, which provides, under control of an INPUT or a RESET, a signal of a CN or a CNB to a pull-up node, outputs, according to a voltage level of the pull-up node, a signal of a CK to an OUT, transmits, under control of a CKB, a CKB to a pull-down node, and pulls down, according to a voltage level of the pull-down node, a voltage level of the OUT; a second output sub-circuit, which outputs, during a scan output stage and under control of a GON, a signal of the OUT to a GOUT; and a transfer sub-circuit,
(Continued)

which pulls down, during a scan transfer stage and under control of a GOFF, a voltage level of the GOUT.

20 Claims, 11 Drawing Sheets

(52) U.S. Cl.
CPC ......... *G09G 3/3674* (2013.01); *G09G 3/3677* (2013.01); *G09G 2310/0202* (2013.01); *G09G 2310/0267* (2013.01); *G09G 2310/0286* (2013.01); *G09G 2310/061* (2013.01); *G09G 2310/08* (2013.01); *G09G 2354/00* (2013.01)

(58) Field of Classification Search
CPC ... G09G 2310/0202; G09G 2310/0267; G09G 2310/0286; G09G 2310/061; G09G 2310/08; G09G 2354/00
See application file for complete search history.

(56) References Cited

U.S. PATENT DOCUMENTS

| | | | | |
|---|---|---|---|---|
| 2015/0187433 A1* | 7/2015 | Zheng | ................. | G09G 3/20 345/207 |
| 2017/0061839 A1* | 3/2017 | Park | ................. | G09G 3/3677 |
| 2018/0053464 A1 | 2/2018 | Lu et al. | | |
| 2018/0103231 A1 | 4/2018 | Ahn et al. | | |
| 2018/0158393 A1* | 6/2018 | Woo | ................. | G09G 3/3266 |
| 2018/0188578 A1* | 7/2018 | Wang | ................. | G02F 1/1343 |
| 2018/0233099 A1* | 8/2018 | Wang | ................. | G09G 3/3677 |
| 2019/0005884 A1* | 1/2019 | Yoo | ................. | G06F 3/011 |
| 2019/0051365 A1 | 2/2019 | Li et al. | | |
| 2019/0139495 A1* | 5/2019 | Qin | ................. | G09G 3/3266 |
| 2020/0135287 A1 | 4/2020 | Han | | |
| 2020/0245120 A1 | 7/2020 | Zong et al. | | |

FOREIGN PATENT DOCUMENTS

| | | |
|---|---|---|
| CN | 109686292 A | 4/2019 |
| CN | 109830256 A | 5/2019 |
| CN | 109859674 A | 6/2019 |
| CN | 109885176 A | 6/2019 |
| CN | 112992247 A | 6/2021 |
| JP | 2018060199 A | 4/2018 |

OTHER PUBLICATIONS

The First Office Action dated Mar. 29, 2022 for Chinese Patent Application No. 202010407362.8 and English Translation.

* cited by examiner

At a scanning transfer stage, a first output sub-circuit provides a signal of a first power supply terminal to a pull-up node under the control of a signal input terminal, and outputs a signal of a first clock signal terminal to a signal output terminal according to a level of the pull-up node; a transfer sub-circuit pulls down a signal of a line output terminal under the control of a line-OFF enable signal; the first output sub-circuit transmits a signal of a second clock signal terminal to a pull-down node under the control of the second clock signal terminal, and pulls down a level of the signal output terminal according to a level of the pull-down node. ~ 100

At a scanning output stage, the first output sub-circuit provides the signal of the first power supply terminal to the pull-up node under the control of the signal input terminal, and outputs the signal of the first clock signal terminal to the signal output terminal according to the level of the pull-up node; the second output sub-circuit outputs the signal of the signal output terminal to the line output terminal under the control of the line-ON enable signal; the first output sub-circuit transmits the signal of the second clock signal terminal to the pull-down node under the control of the second clock signal terminal, and pulls down the level of the signal output terminal according to the level of the pull-down node. ~ 101

FIG. 11

At a scanning transfer stage, a first output sub-circuit provides a signal of a second power supply terminal to a pull-up node under the control of a reset terminal, and outputs a signal of the first clock signal terminal to a signal output terminal according to a level of the pull-up node; a transfer sub-circuit pulls down a signal of a line output terminal under the control of a line-OFF enable signal; the first output sub-circuit transmits a signal of a second clock signal terminal to a pull-down node under the control of the second clock signal terminal, and pulls down a level of the signal output terminal according to a level of the pull-down node. ~ 102

At a scanning output stage, the first output sub-circuit provides the signal of the second power supply terminal to the pull-up node under the control of the reset terminal, and outputs the signal of the first clock signal terminal to the signal output terminal according to the level of the pull-up node; the second output sub-circuit outputs the signal of the signal output terminal to the line output terminal under the control of the line-ON enable signal; and the first output sub-circuit transmits the signal of the second clock signal terminal to the pull-down node under the control of the second clock signal terminal, and pulls down the level of the signal output terminal according to the level of the pull-down node. ~ 103

FIG. 12

At the scanning transfer stage of the non-visuosensory area, enable the shift registers of scanning lines after the m-th line to transfer the signal of the signal output terminal line by line at the first frequency — 205

At the scanning output stage of the visuosensory area, enable shift registers from the n-th line to the m-th line to output the signal of the line output terminal line by line at the second frequency — 206

At the first scanning output stage of the non-visuosensory area, enable the shift registers of scanning lines after the m-th line to output the signal of the line output terminal line by line at the second frequency — 207

At the scanning transfer stage of the visuosensory area, enable shift registers from the n-th line to the m-th line to transfer the signal of the signal output terminal line by line at the first frequency — 208

At the second scanning output stage of the non-visuosensory area, enable the shift registers of scanning lines before the n-th line to output the signal of the line output terminal line by line at the second frequency — 209

FIG. 18

SHIFT REGISTER IN DISPLAY, GATE DRIVE CIRCUIT, DISPLAY DEVICE, AND DRIVING METHOD FOR SAME

CROSS-REFERENCE TO RELATED APPLICATIONS

The present application is a U.S. National Phase Entry of International Application No. PCT/CN2021/086514 having an international filing date of Apr. 12, 2021, which claims the priority of the Chinese Patent Application No. 2020104073628, entitled "Shift Register, Gate Drive Circuit, Display Device, and Driving Method for Same", filed to the CNIPA on May 14, 2020. The above-identified applications are incorporated into the present application by reference in their entireties.

TECHNICAL FIELD

Embodiments of the present disclosure relate to, but are not limited to, the technical field of display, in particular to a shift register, a gate drive circuit, a display device, a driving method for the same.

BACKGROUND

With the development of the display industry, users have increasingly high requirements on display quality, especially in specific display scenes such as Virtual Reality (VR), Augmented Reality (AR), immersive games, racing sports, etc., which require very high image refresh speed of display devices. At present, problems of dynamic blur, display ghosting etc. are serious under the conventional display frequency, while increasing a display refresh frequency will directly lead to problems such as the multiplication of display transmission data and insufficient pixel charging, and will further increase the number of data transmission interfaces, data transmission bandwidth, and power consumption of the display devices, etc., thus seriously affecting immersive experience of users in the display devices.

SUMMARY

The following is a summary of subject matter described in detail herein. This summary is not intended to limit the protection scope of the claims.

The present disclosure provides a shift register, including: a first output sub-circuit, a second output sub-circuit and a transfer sub-circuit, wherein: the first output sub-circuit is configured to provide a signal of a first power supply terminal or a second power supply terminal to a pull-up node under the control of a signal input terminal or a reset terminal, and output a signal of a first clock signal terminal to a signal output terminal according to a level of the pull-up node; transmit a signal of a second clock signal terminal to a pull-down node under the control of the second clock signal terminal, and pull down a level of the signal output terminal according to a level of the pull-down node; the second output sub-circuit is configured to output a signal of the signal output terminal to a line output terminal under the control of a line-ON enable signal at a scanning output stage; and the transfer sub-circuit is configured to pull down a level of the line output terminal under the control of a line-OFF enable signal at a scanning transfer stage.

In some possible implementations, a frequency of an input signal of the first clock signal terminal and a frequency of an input signal of the second clock signal terminal at the scanning transfer stage are the same; a frequency of an input signal of the first clock signal terminal and a frequency of an input signal of the second clock signal terminal at the scanning output stage are the same, and the frequency of the input signal of the first clock signal terminal or the frequency of the input signal of the second clock signal terminal at the scanning output stage is less than the frequency of the input signal of the first clock signal terminal or the frequency of the input signal of the second clock signal terminal at the scanning transfer stage.

In some possible implementations, the second output sub-circuit includes: a first transistor, and wherein: a control electrode of the first transistor is connected with the line-ON enable terminal, a first electrode of the first transistor is connected with the signal output terminal, and a second electrode of the first transistor is connected with the line output terminal.

In some possible implementations, the transfer sub-circuit includes: a second transistor, and wherein: a control electrode of the second transistor is connected with the line-OFF enable terminal, a first electrode of the second transistor is connected with a third power supply terminal, and a second electrode of the second transistor is connected with the line output terminal.

In some possible implementations, the first output sub-circuit includes an input sub-circuit, a first reset sub-circuit, an intermediate output sub-circuit, a pull-down sub-circuit, a pull-down control sub-circuit and a second reset sub-circuit, wherein: the input sub-circuit is configured to provide the signal of the first power supply terminal to the pull-up node under the control of the signal input terminal; the first reset sub-circuit is configured to provide the signal of the second power supply terminal to the pull-up node under the control of the reset terminal; the intermediate output sub-circuit is configured to output the signal of the first clock signal terminal to the signal output terminal according to the level of the pull-up node; the pull-down control sub-circuit is configured to pull down the level of the pull-down node according to the level of the pull-up node; transmit the signal of the second clock signal terminal to the pull-down node under the control of the second clock signal terminal, and pull down the level of the pull-up node according to the level of the pull-down node; the pull-down sub-circuit is configured to pull down the level of the pull-down node according to the level of the signal output terminal; pull down the level of the signal output terminal according to the level of the pull-down node; and the second reset sub-circuit is configured to reset the pull-up node under the control of a total reset terminal.

In some possible implementations, the input sub-circuit includes: a third transistor, and the first reset sub-circuit includes: a fourth transistor, wherein: a control electrode of the third transistor is connected with the signal input terminal, a first electrode of the third transistor is connected with the first power supply terminal, and a second electrode of the third transistor is connected with the pull-up node; and a control electrode of the fourth transistor is connected with the reset terminal, a first electrode of the fourth transistor is connected with the second power supply terminal, and a second electrode of the fourth transistor is connected with the pull-up node.

In some possible implementations, the intermediate output sub-circuit includes a fifth transistor and a first capacitor, and the second reset sub-circuit includes a sixth transistor, wherein: a control electrode of the fifth transistor is connected with the pull-up node, a first electrode of the fifth transistor is connected with the first clock signal terminal, and a second electrode of the fifth transistor is connected with the signal output terminal; one terminal of the first capacitor is connected with the pull-up node, and the other terminal of the first capacitor is connected with the signal output terminal; and a control electrode of the sixth transistor is connected with the total reset terminal, a first electrode of the sixth transistor is connected with a third power supply terminal, and a second electrode of the sixth transistor is connected with the pull-up node.

In some possible implementations, the pull-down control sub-circuit includes: a seventh transistor, an eighth transistor, and a ninth transistor, and the pull-down sub-circuit includes: a tenth transistor, an eleventh transistor, and a second capacitor, a control electrode of the seventh transistor is connected with the pull-down node, a first electrode of the seventh transistor is connected with a third power supply terminal, and a second electrode of the seventh transistor is connected with the pull-up node; a control electrode of the eighth transistor is connected with the pull-up node, a first electrode of the eighth transistor is connected with the third power supply terminal, and a second electrode of the eighth transistor is connected with the pull-down node; both a control electrode and a first electrode of the ninth transistor are connected with the second clock signal terminal, and a second electrode of the ninth transistor is connected with the pull-down node; a control electrode of the tenth transistor is connected with the pull-down node, a first electrode of the tenth transistor is connected with the third power supply terminal, a second electrode of the tenth transistor is connected with the signal output terminal; a control electrode of the eleventh transistor is connected with the signal output terminal, a first electrode of the eleventh transistor is connected with the third power supply terminal, and a second electrode of the eleventh transistor is connected with the pull-down node; and one terminal of the second capacitor is connected with the third power supply terminal, and the other terminal of the second capacitor is connected with the pull-down node.

In some possible implementations, the second output sub-circuit includes a first transistor, the transfer sub-circuit includes a second transistor, and the first output sub-circuit includes a third transistor, a fourth transistor, a fifth transistor, a first capacitor, a sixth transistor, a seventh transistor, an eighth transistor, a ninth transistor, a tenth transistor, an eleventh transistor and a second capacitor, wherein: a control electrode of the first transistor is connected with the line-ON enable terminal, a first electrode of the first transistor is connected with the signal output terminal, and a second electrode of the first transistor is connected with the line output terminal; a control electrode of the second transistor is connected with the line-OFF enable terminal, a first electrode of the second transistor is connected with a third power supply terminal, and a second electrode of the second transistor is connected with the line output terminal; a control electrode of the third transistor is connected with the signal input terminal, a first electrode of the third transistor is connected with the first power supply terminal, and a second electrode of the third transistor is connected with the pull-up node; a control electrode of the fourth transistor is connected with the reset terminal, a first electrode of the fourth transistor is connected with the second power supply terminal, and a second electrode of the fourth transistor is connected with the pull-up node; a control electrode of the fifth transistor is connected with the pull-up node, a first electrode of the fifth transistor is connected with the first clock signal terminal, and a second electrode of the fifth transistor is connected with the signal output terminal; one terminal of the first capacitor is connected with the pull-up node, and the other terminal of the first capacitor is connected with the signal output terminal; a control electrode of the sixth transistor is connected with a total reset terminal, a first electrode of the sixth transistor is connected with the third power supply terminal, and a second electrode of the sixth transistor is connected with the pull-up node; a control electrode of the seventh transistor is connected with the pull-down node, a first electrode of the seventh transistor is connected with the third power supply terminal, and a second electrode of the seventh transistor is connected with the pull-up node; a control electrode of the eighth transistor is connected with the pull-up node, a first electrode of the eighth transistor is connected with the third power supply terminal, and a second electrode of the eighth transistor is connected with the pull-down node; both a control electrode and a first electrode of the ninth transistor are connected with the second clock signal terminal, and a second electrode of the ninth transistor is connected with the pull-down node; a control electrode of the tenth transistor is connected with the pull-down node, a first electrode of the tenth transistor is connected with the third power supply terminal, a second electrode of the tenth transistor is connected with the signal output terminal; a control electrode of the eleventh transistor is connected with the signal output terminal, a first electrode of the eleventh transistor is connected with the third power supply terminal, and a second electrode of the eleventh transistor is connected with the pull-down node; and one terminal of the second capacitor is connected with the third power supply terminal, and the other terminal of the second capacitor is connected with the pull-down node.

The present disclosure also provides a gate drive circuit, including multiple cascaded shift registers as described above.

The present disclosure also provides a display device, including: a sensor, a processor and a display panel, the display panel includes the gate drive circuit as described above, wherein: the sensor is configured to identify a position of a user's visuosensory area and transmit the identified position of the visuosensory area to the processor; and the processor is configured to detect whether the position of the visuosensory area at a current moment is the same as the position of the visuosensory area at a previous moment, calculate a number of scanning lines corresponding to the position of the visuosensory area at the current moment if the position of the visuosensory area at the current moment is different from the position of the visuosensory area at the previous moment, and update a driving timing of the gate drive circuit according to the calculated number of scanning lines corresponding to the position of the visuosensory area.

The present disclosure also provides a driving method for a shift register, which may be applied to the shift register as described in any of the previous embodiments, the driving method includes, during a forward scanning: at the scanning output stage, providing, by the first output sub-circuit, the signal of the first power supply terminal to the pull-up node under the control of the signal input terminal, and outputting the signal of the first clock signal terminal to the signal output terminal according to the level of the pull-up node; outputting, by the second output sub-circuit, the signal of the signal output terminal to the line output terminal under the control of the line-ON enable signal; and transmitting, by the first output sub-circuit, the signal of the second clock signal terminal to the pull-down node under the control of the second clock signal terminal, and pulling down the level of the signal output terminal according to the level of the pull-down node; and at the scanning transfer stage, providing, by the first output sub-circuit, the signal of the first power supply terminal to the pull-up node under the control of the signal input terminal, and outputting the signal of the first clock signal terminal to the signal output terminal according to the level of the pull-up node; pulling down, by the transfer sub-circuit, the signal of the line output terminal under the control of the line-OFF enable signal; and transmitting, by the first output sub-circuit, the signal of the second clock signal terminal to the pull-down node under the control of the second clock signal terminal, and pulling down the level of the signal output terminal according to the level of the pull-down node.

In some possible implementations, the driving method includes, during a reverse scanning: at the scanning transfer stage, providing, by the first output sub-circuit, the signal of the second power supply terminal to the pull-up node under the control of the reset terminal, and outputting the signal of the first clock signal terminal to the signal output terminal according to the level of the pull-up node; pulling down, by the transfer sub-circuit, the signal of the line output terminal under the control of the line-OFF enable signal; and transmitting, by the first output sub-circuit, the signal of the second clock signal terminal to the pull-down node under the control of the second clock signal terminal, and pulling down the level of the signal output terminal according to the level of the pull-down node; and at the scanning output stage, providing, by the first output sub-circuit, the signal of the second power supply terminal to the pull-up node under the control of the reset terminal, and outputting the signal of the first clock signal terminal to the signal output terminal according to the level of the pull-up node; outputting, by the second output sub-circuit, the signal of the signal output terminal to the line output terminal under the control of the line-ON enable signal; transmitting, by the first output sub-circuit, the signal of the second clock signal terminal to the pull-down node under the control of the second clock signal terminal, and pulling down the level of the signal output terminal according to the level of the pull-down node.

The present disclosure also provides a driving method for a gate drive circuit, the driving method includes, during a forward scanning: at a scanning transfer stage of a non-visuosensory area, enabling shift registers of scanning lines before an n-th line to transfer a signal of a signal output terminal line by line at a first frequency; at a scanning output stage of a visuosensory area, enabling shift registers from the n-th line to an m-th line to output a signal of a line output terminal line by line at a second frequency, wherein the second frequency is less than the first frequency; at a first scanning output stage of the non-visuosensory area, enabling the shift registers of scanning lines before the n-th line to output the signal of the line output terminal line by line at the second frequency; at a scanning transfer stage of the visuosensory area, enabling the shift registers from the n-th line to the m-th line to transfer the signal of the signal output terminal line by line at the first frequency; and at a second scanning output stage of the non-visuosensory area, enabling shift registers of scanning lines after the m-th line to output the signal of the line output terminal line by line at the second frequency, wherein n is a natural number greater than or equal to 1, m is a natural number greater than n and less than or equal to N, and N is a total number of scanning lines.

In some possible implementations, the driving method includes, during a reverse scanning: at the scanning transfer stage of the non-visuosensory area, enabling the shift registers of scanning lines after the m-th line to transfer the signal of the signal output terminal line by line at the first frequency; at the scanning output stage of the visuosensory area, enabling the shift registers from the n-th line to the m-th line to output the signal of the line output terminal line by line at the second frequency; at the first scanning output stage of the non-visuosensory area, enabling the shift registers of scanning lines after the m-th line to output the signal of the line output terminal line by line at the second frequency; at the scanning transfer stage of the visuosensory area, enabling the shift registers from the n-th line to the m-th line to transfer the signal of the signal output terminal line by line at the first frequency; and at the second scanning output stage of the non-visuosensory area, enabling the shift registers of scanning lines before the n-th line to output the signal of the line output terminal line by line at the second frequency.

In some possible implementations, the driving method further includes a scanning blank stage between the scanning output stage of the visuosensory area and the first scanning output stage of the non-visuosensory area and after the second scanning output stage of the non-visuosensory area, wherein: at the scanning blank stage, levels of pull-up nodes in all shift registers are pulled down to reset shift registers of all scanning lines.

Other aspects will become apparent upon reading and understanding accompanying drawings and the detailed description.

BRIEF DESCRIPTION OF DRAWINGS

The accompanying drawings are used to provide an understanding to the technical solution of the embodiments of the present disclosure, form a part of the specification, and are adopted to explain, together with the embodiments of the present disclosure, the technical solutions of the embodiments of the present disclosure but are not intended to form limits to the technical solutions of the embodiments of the present disclosure.

FIG. 11 is a flowchart of a driving method for a shift register according to the present disclosure.

FIG. 12 is another flowchart of a driving method for a shift register according to the present disclosure.

FIG. 18 is another flowchart of a driving method for a gate drive circuit according to the present disclosure.

DETAILED DESCRIPTION

The embodiments of the present disclosure will be described below in combination with the drawings in detail. It is to be noted that the embodiments in the present disclosure and features in the embodiments may be combined with each other without conflict.

Unless otherwise defined, technical terms or scientific terms used in the embodiments of the present disclosure should have the same meanings as commonly understood by those of ordinary skill in the art that the present disclosure belongs to. "First", "second", and similar terms used in the embodiments of the present disclosure do not represent any sequence, number, or significance but are only adopted to distinguish different components. "Include", "contain", or a similar term means that an element or object appearing before the term covers an element or object and equivalent thereof listed after the term and does not exclude other elements or objects.

It can be understood by those skilled in the art that a transistor adopted in all the embodiments of the present disclosure may be a thin film transistor, or a field-effect transistor, or another device with the same characteristic. Preferably, the thin film transistor used in the embodiments of the present disclosure may be oxide semiconductor transistor. A source and drain of the transistor used herein are symmetric, so the source and the drain may be interchanged. In the embodiments of the present disclosure, for distinguishing the two electrodes, except a gate, of the transistor, one electrode is referred to as a first electrode, the other electrode is referred to as a second electrode, the first electrode may be the source or the drain, and the second electrode may be the drain or the source.

Figure 1:
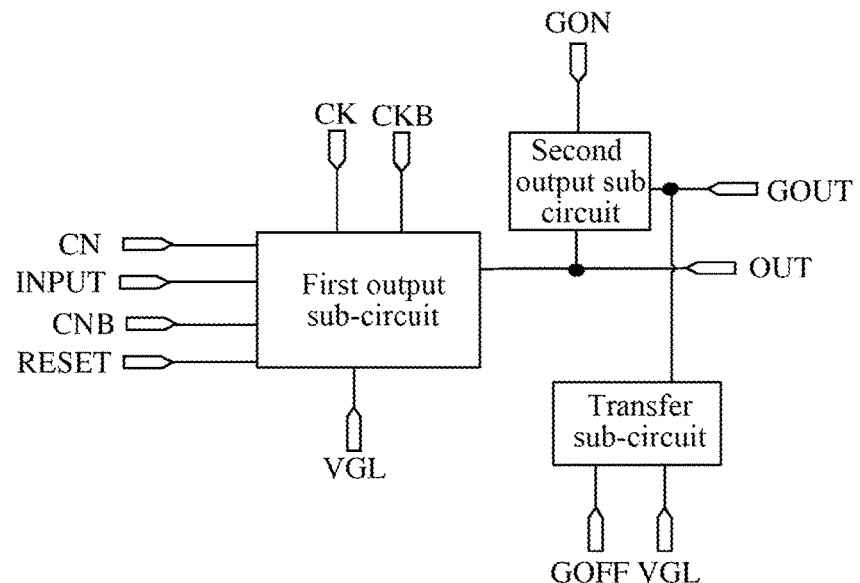
FIG. 1 is a schematic diagram of a structure of a shift register according to the present disclosure.

An embodiment of the present disclosure provides a shift register. FIG. 1 is a schematic diagram of a structure of a shift register according to an embodiment of the present disclosure. As shown in FIG. 1, the shift register according to an embodiment of the present disclosure includes a first output sub-circuit, a second output sub-circuit, and a transfer sub-circuit.

The first output sub-circuit is connected with a signal input terminal INPUT, a reset terminal RESET, a first power supply terminal CN, a second power supply terminal CNB, a pull-up node PU (not shown in FIG. 1), a pull-down node PD (not shown in FIG. 1), a first clock signal terminal CK, a second clock signal terminal CKB, a third power supply terminal VGL, and a signal output terminal OUT respectively. The first output sub-circuit is configured to provide a signal of the first power supply terminal CN or the second power supply terminal CNB to the pull-up node PU under the control of the signal input terminal INPUT or the reset terminal RESET, and output the signal of the first clock signal terminal CK to the signal output terminal OUT according to a level of the pull-up node PU; transmit the signal of the second clock signal terminal CKB to the pull-down node PD under the control of the second clock signal terminal CKB, and pull down a level of the signal output terminal OUT according to a level of the pull-down node PD.

The second output sub-circuit is connected with a line-ON enable terminal GON, a line output terminal GOUT, and the signal output terminal OUT respectively, and is configured to output the signal of the signal output terminal OUT to the line output terminal GOUT under the control of a signal of the line-ON enable terminal GON (i.e. a line-ON enable signal) at a scanning output stage.

The transfer sub-circuit is connected with a line-OFF enable terminal GOFF, the third power supply terminal VGL, and the line output terminal GOUT respectively, and is configured to pull down a level of the line output terminal GOUT under the control of a signal of the line-OFF enable terminal GOFF (i.e. a line-OFF enable signal) at a scanning transfer stage.

In the present disclosure, a line output terminal GOUT is connected with a pixel line, but not with previous and next shift registers, and only line scanning and outputting is performed, transfer and reset of shift register is not performed. The signal output terminal OUT is not connected with the pixel line, but only connected with a signal input terminal INPUT of the next shift register and a reset terminal RESET of the previous shift register, that is, only transfer and reset of shift register is performed, and line scanning and outputting is performed. Since the signal output terminal OUT is not loaded with large Gate Line Loading, ultra-high speed shift register cascade transfer may be performed under ultra-low load.

In an exemplary embodiment, a frequency of an input signal of the first clock signal terminal and a frequency of an input signal of the second clock signal terminal at the scanning transfer stage are the same; a frequency of an input signal of the first clock signal terminal and a frequency of an input signal of the second clock signal terminal at the scanning output stage are the same, and the frequency of the input signal of the first clock signal terminal or the frequency of the input signal of the second clock signal terminal at the scanning output stage is less than the frequency of the input signal of the first clock signal terminal or the frequency of the input signal of the second clock signal terminal at the scanning transfer stage.

According to the shift register of the present disclosure, the second output sub-circuit outputs the signal of the signal output terminal OUT to the line output terminal GOUT under the control of the signal of the line-ON enable terminal GON at the scanning output stage, and the transfer sub-circuit pulls down the level of the line output terminal GOUT under the control of the signal of the line-OFF enable terminal GOFF at the scanning transfer stage. On the premise of not increasing a display refresh frequency, a visuosensory area rapidly switched by a user may be refreshed immediately, and the image information focused by the user may be rendered at a high speed, so as to provide solutions to the problems of dynamic blur, ghosting etc. in conventional display, and provide the user with a good visual experience.

Figure 2:
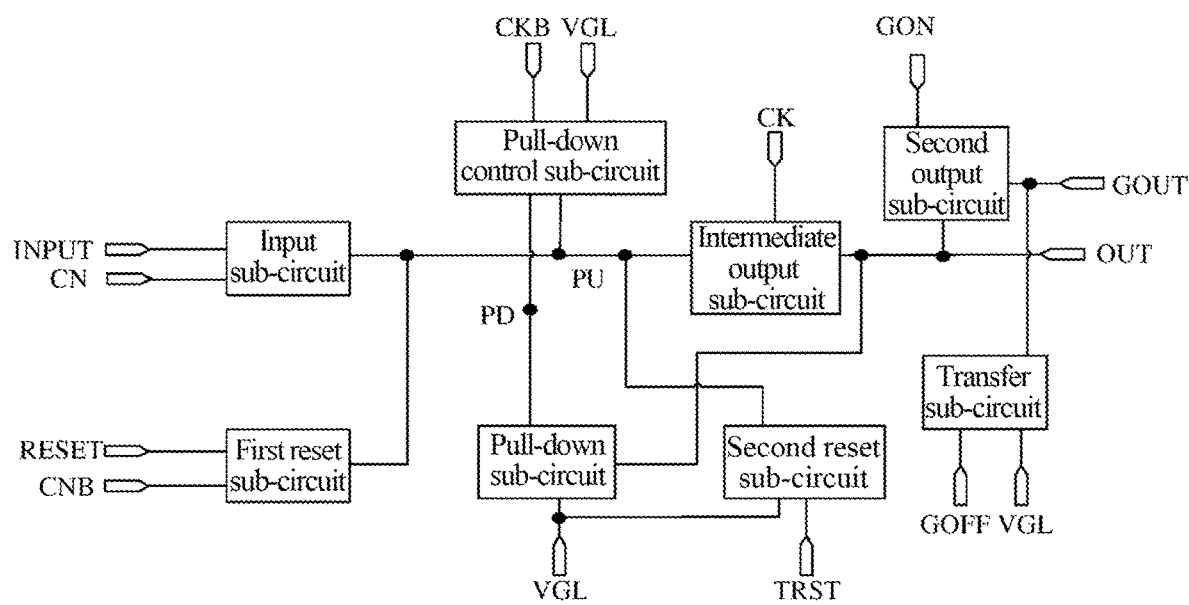
FIG. 2 is an equivalent circuit diagram of a second output sub-circuit according to the present disclosure.

In an exemplary embodiment, as shown in FIG. 2, the first output sub-circuit includes an input sub-circuit, a first reset sub-circuit, an intermediate output sub-circuit, a pull-down sub-circuit, a pull-down control sub-circuit and a second reset sub-circuit.

The input sub-circuit is connected with a signal input terminal INPUT, a first power supply terminal CN, and a pull-up node PU respectively, and is configured to provide a signal of the first power supply terminal CN to the pull-up node PU under the control of the signal input terminal INPUT.

The first reset sub-circuit is connected with a reset terminal RESET, a second power supply terminal CNB, and the pull-up node PU respectively, and is configured to provide a signal of the second power supply terminal CNB to the pull-up node PU under the control of the reset terminal RESET.

The intermediate output sub-circuit is connected with a first clock signal terminal CLK, the pull-up node PU, and a signal output terminal OUT respectively, and is configured to output a signal of the first clock signal terminal CLK to the signal output terminal OUT according to a level of the pull-up node PU.

The pull-down control sub-circuit is connected with a second clock signal terminal CKB, the pull-up node PU, a pull-down node PD, and a third power supply terminal VGL respectively, and is configured to pull down a level of the pull-down node PD according to the level of the pull-up node PU; transmit a signal of the second clock signal terminal CKB to the pull-down node PD under the control of the second clock signal terminal CKB, and pull down the level of the pull-up node PU according to the level of the pull-down node PD.

The pull-down sub-circuit is connected with the signal output terminal OUT, the pull-down node PD, and the third power supply terminal VGL respectively, and is configured to pull down the level of the pull-down node PD according to a level of the signal output terminal OUT; pull down a level of the signal output terminal OUT according to the level of the pull-down node PD.

The second reset sub-circuit is connected with the pull-up node PU, a total reset terminal TRST, and the third power supply terminal VGL respectively, and is configured to reset the pull-up node PU under the control of the total reset terminal TRST.

FIG. 2 shows an exemplary structure of the first output sub-circuit. Those skilled in the art may easily understand that implementations of the first output sub-circuit are not limited to this as long as its functions can be achieved.

In the present disclosure, the total reset terminal TRST has two functions. The first function is to reset a last line of shift registers. Since there is no subsequent unit to provide a reset signal to the last line of shift registers, the total reset terminal TRST is separately set to reset the last line of shift registers. The second function is to reset shift registers of all lines in a scanning blank stage to improve circuit stability. In the present disclosure, a frame transmission process includes two scanning blank stages, one is after the end of the sub-frame transmission in a visuosensory area and the other is after the end of the sub-frame transmission in a non-visuosensory area. At the scanning blank stage, the total reset terminal TRST inputs a high-level signal, and at the same time pulls down levels of pull-up nodes PU in all shift registers, which can improve the reliability of the shift registers. The reset terminal RESET is used for a next shift register to reset a previous shift register.

Figure 3:
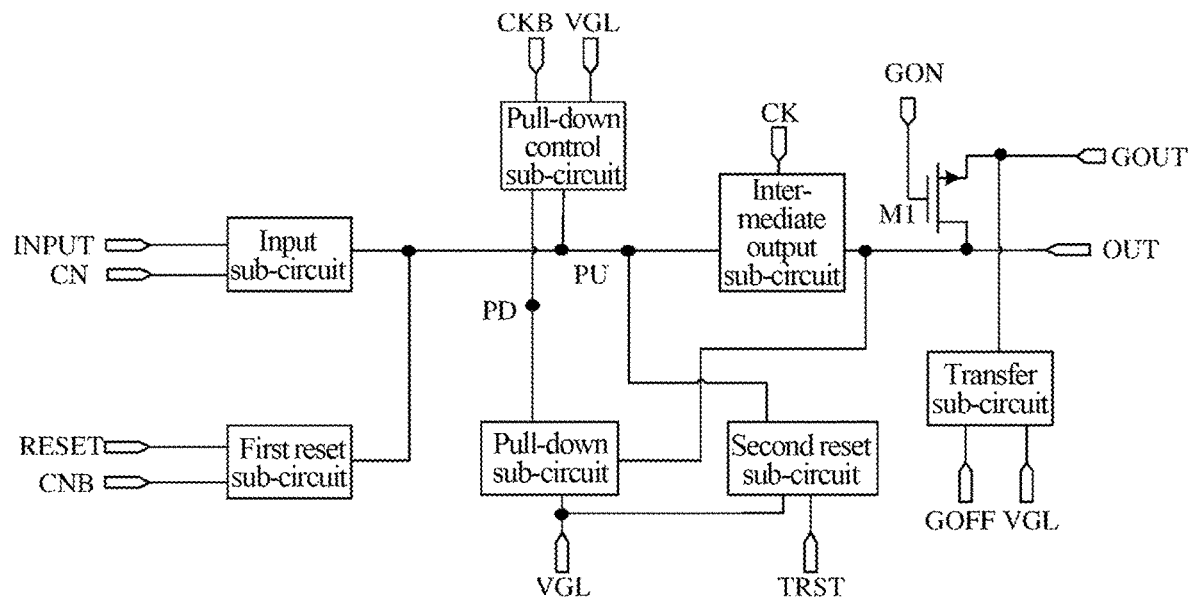
FIG. 3 is an equivalent circuit diagram of a transfer sub-circuit according to the present disclosure.

In an exemplary embodiment, FIG. 3 is an equivalent circuit diagram of a second output sub-circuit according to the present disclosure. As shown in FIG. 3, the second output sub-circuit according to the present disclosure includes a first transistor M1.

A control electrode of the first transistor M1 is connected with a line-ON enable terminal GON, a first electrode of the first transistor M1 is connected with a signal output terminal OUT, and a second electrode of the first transistor M1 is connected with a line output terminal GOUT.

FIG. 3 shows an exemplary structure of the second output sub-circuit. Those skilled in the art may easily understand that implementations of the second output sub-circuit are not limited to this as long as its functions can be achieved.

Figure 4:
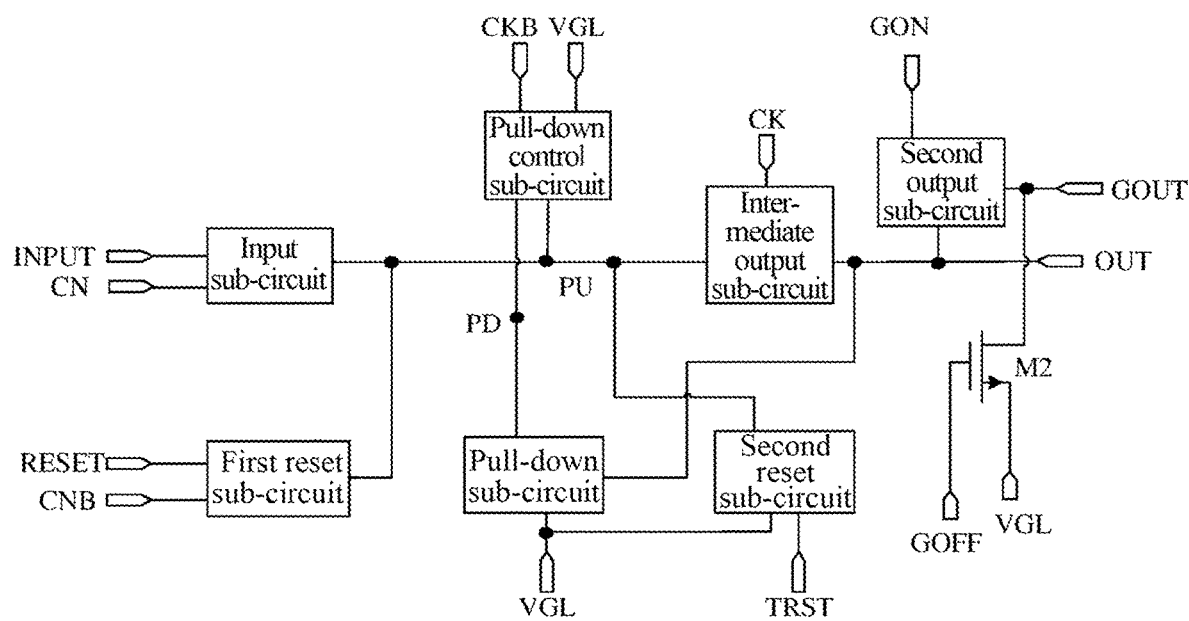
FIG. 4 is an equivalent circuit diagram of a transfer sub-circuit according to the present disclosure.

In an exemplary embodiment, FIG. 4 is an equivalent circuit diagram of a transfer sub-circuit according to an embodiment of the present disclosure. As shown in FIG. 4, the transfer sub-circuit according to the present disclosure includes a second transistor M2.

A control electrode of the second transistor M2 is connected with a line-OFF enable terminal GOFF, a first electrode of the second transistor M2 is connected with a third power supply terminal VGL, and a second electrode of the second transistor M2 is connected with a line output terminal GOUT.

FIG. 4 shows an exemplary structure of the transfer sub-circuit. Those skilled in the art may easily understand that implementations of the transfer sub-circuit are not limited to this as long as its functions can be achieved.

Figure 5:
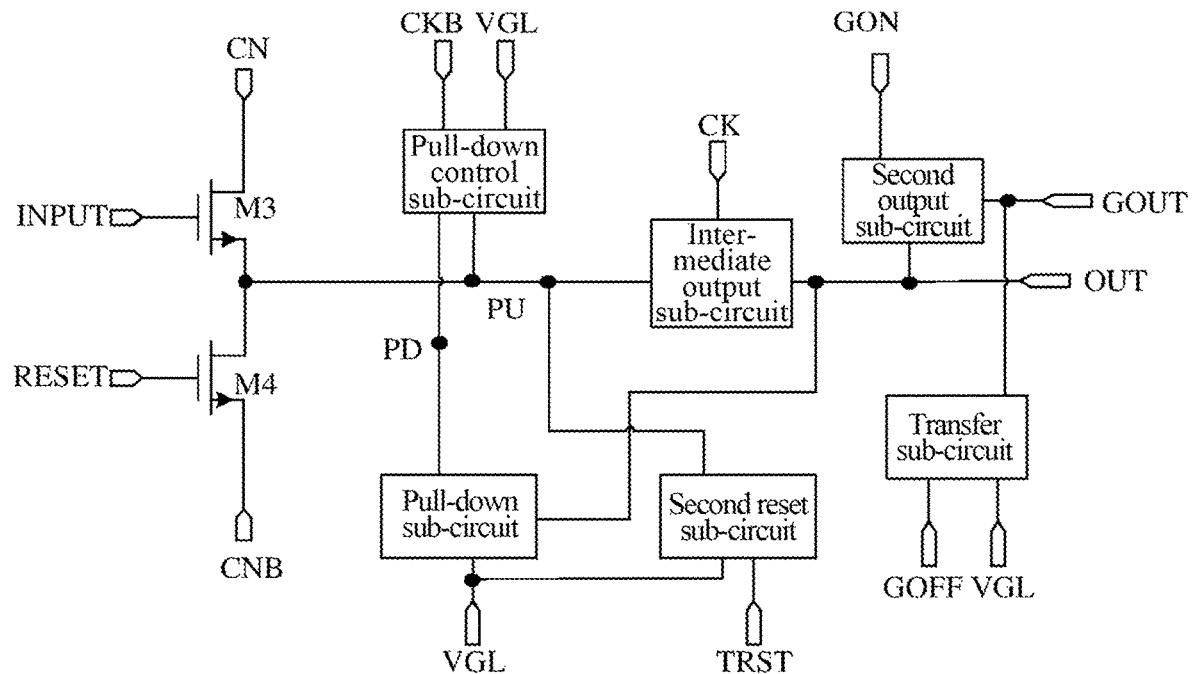
FIG. 5 is an equivalent circuit diagram of an input sub-circuit and a first reset sub-circuit according to the present disclosure.

In an exemplary embodiment, FIG. 5 is an equivalent circuit diagram of an input sub-circuit and a first reset sub-circuit according to the present disclosure. As shown in FIG. 5, the input sub-circuit according to the present disclosure includes a third transistor M3, and the first reset sub-circuit includes a fourth transistor M4.

A control electrode of the third transistor M3 is connected with a signal input terminal INPUT, a first electrode of the third transistor M3 is connected with a first power supply terminal CN, and a second electrode of the third transistor M3 is connected with a pull-up node PU; a control electrode of the fourth transistor M4 is connected with a reset terminal RESET, a first electrode of the fourth transistor M4 is connected with a second power supply terminal CNB, and a second electrode of the fourth transistor M4 is connected with the pull-up node PU.

FIG. 5 shows an exemplary structure of the input sub-circuit and the first reset sub-circuit. Those skilled in the art may easily understand that implementations of the input sub-circuit and the first reset sub-circuit are not limited to this as long as their functions can be achieved.

Figure 6:
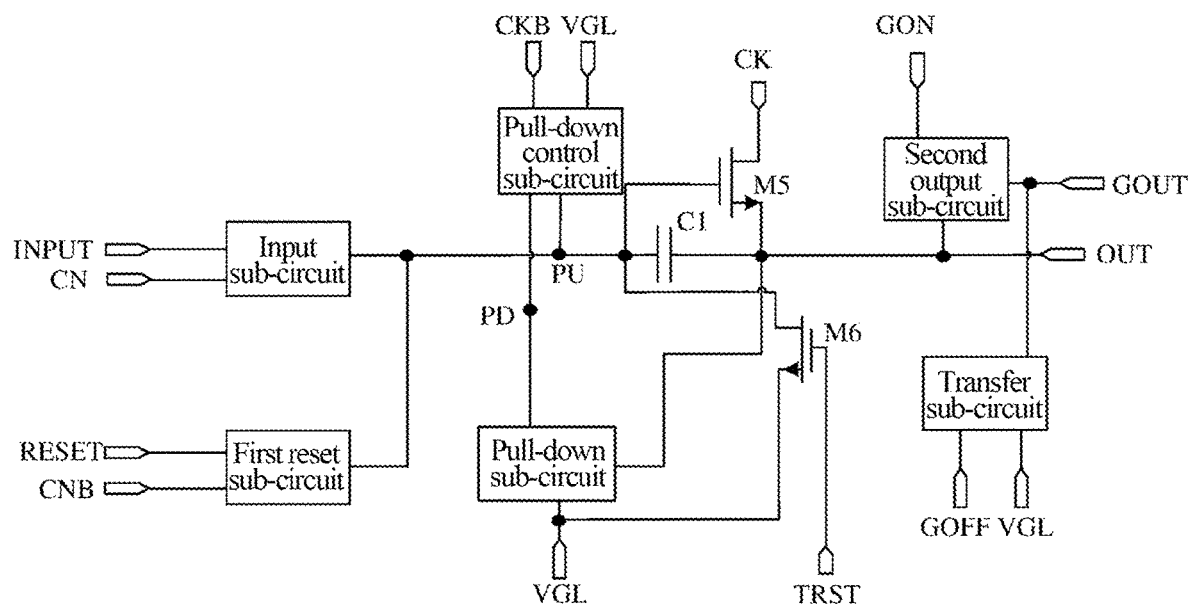
FIG. 6 is an equivalent circuit diagram of an intermediate output sub-circuit and a second reset sub-circuit according to the present disclosure.

In an exemplary embodiment, FIG. 6 is an equivalent circuit diagram of an intermediate output sub-circuit and a second reset sub-circuit according to the present disclosure. As shown in FIG. 6, the intermediate output sub-circuit according to the present disclosure includes a fifth transistor M5 and a first capacitor C1, and the second reset sub-circuit includes a sixth transistor M6.

A control electrode of the fifth transistor M5 is connected with a pull-up node PU, a first electrode of the fifth transistor M5 is connected with a first clock signal terminal CK, and a second electrode of the fifth transistor M5 is connected with a signal output terminal OUT; one terminal of the first capacitor C1 is connected with the pull-up node PU, and the other terminal of the first capacitor C1 is connected with the signal output terminal OUT; a control electrode of the sixth transistor M6 is connected with a total reset terminal TRST, a first electrode of the sixth transistor M6 is connected with a third power supply terminal VGL, and a second electrode of the sixth transistor M6 is connected with the pull-up node PU.

FIG. 6 shows an exemplary structure of the intermediate output sub-circuit and the second reset sub-circuit. Those skilled in the art may easily understand that implementations of the input sub-circuit and the first reset sub-circuit are not limited to this as long as their functions can be achieved.

Figure 7:
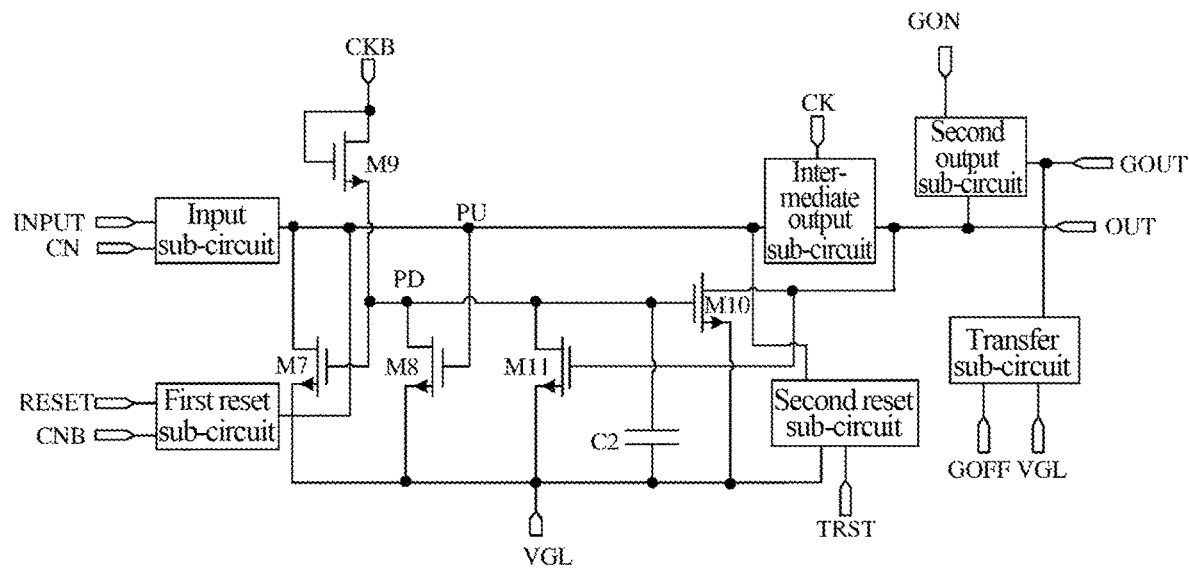
FIG. 7 is an equivalent circuit diagram of a pull-down control sub-circuit and a pull-down sub-circuit according to the present disclosure.

In an exemplary embodiment, FIG. 7 is an equivalent circuit diagram of a pull-down control sub-circuit and a pull-down sub-circuit according to the present disclosure. As shown in FIG. 7, the pull-down control sub-circuit according to the present disclosure includes a seventh transistor M7, an eighth transistor M8, and a ninth transistor M9, and the pull-down sub-circuit includes a tenth transistor M10, an eleventh transistor M11, and a second capacitor C2.

A control electrode of the seventh transistor M7 is connected with the pull-down node PD, a first electrode of the seventh transistor M7 is connected with a third power supply terminal VGL, and a second electrode of the seventh transistor M7 is connected with a pull-up node PU; a control electrode of the eighth transistor M8 is connected with a pull-up node PU, a first electrode of the eighth transistor M8 is connected with the third power supply terminal VGL, and a second electrode of the eighth transistor M8 is connected with the pull-down node PD; both a control electrode and a first electrode of the ninth transistor M9 are connected with a second clock signal terminal CKB, and a second electrode of the ninth transistor M9 is connected with the pull-down node PD; a control electrode of the tenth transistor M10 is connected with the pull-down node PD, a first electrode of the tenth transistor M10 is connected with the third power supply terminal VGL, and a second electrode of the tenth transistor M10 is connected with a signal output terminal OUT; a control electrode of the eleventh transistor M11 is connected with the signal output terminal OUT, a first electrode of the eleventh transistor M11 is connected with the third power supply terminal VGL, and a second electrode of the eleventh transistor M11 is connected with the pull-down node PD; one terminal of the second capacitor C2 is connected with the third power supply terminal VGL, and the other terminal of the second capacitor C2 is connected with the pull-down node PD.

FIG. 7 shows an exemplary structure of the pull-down control sub-circuit and the pull-down sub-circuit. Those skilled in the art may easily understand that implementations of the input sub-circuit and the first reset sub-circuit are not limited to this as long as their functions can be achieved.

Figure 8:
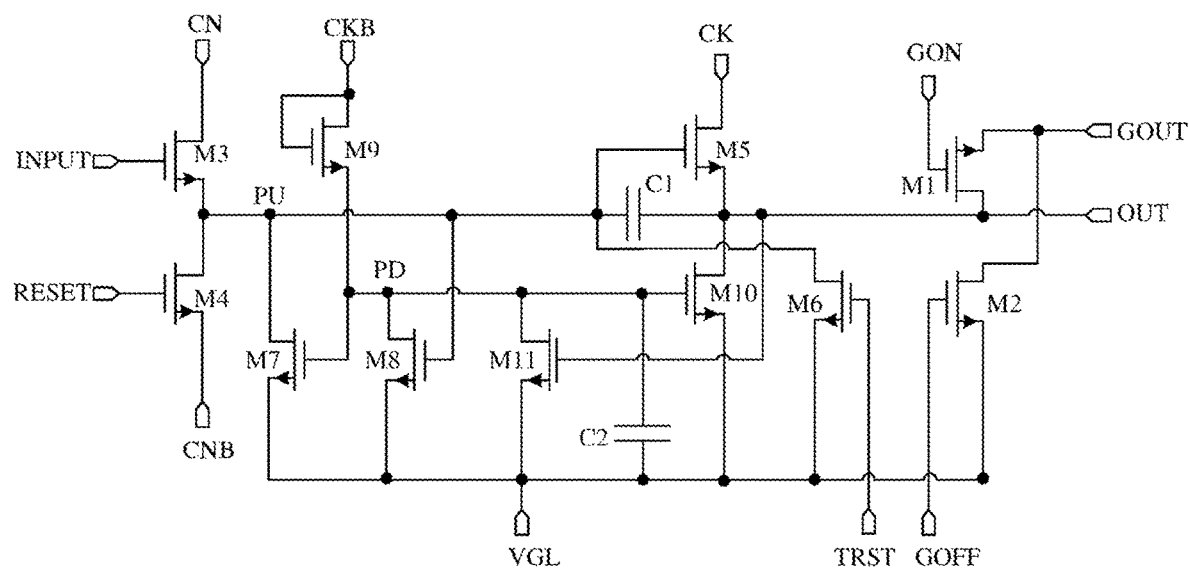
FIG. 8 is an equivalent circuit diagram of a shift register according to the present disclosure.

FIG. 8 is an equivalent circuit diagram of a shift register according to an embodiment of the present disclosure. As shown in FIG. 8, in the shift register according to the present disclosure, a second output sub-circuit includes a first transistor M1, a transfer sub-circuit includes a second transistor M2, an input sub-circuit includes a third transistor M3, a first reset sub-circuit includes a fourth transistor M4, an intermediate output sub-circuit includes a fifth transistor M5 and a first capacitor C1, and a second reset sub-circuit includes a sixth transistor M6, a pull-down control sub-circuit includes a seventh transistor M7, an eighth transistor M8 and a ninth transistor M9, and a pull-down sub-circuit includes a tenth transistor M10, an eleventh transistor M11 and a second capacitor C2.

A control electrode of the first transistor M1 is connected with a line-ON enable terminal GON, a first electrode of the first transistor M1 is connected with a signal output terminal OUT, and a second electrode of the first transistor M1 is connected with a line output terminal GOUT; a control electrode of the second transistor M2 is connected with a line-OFF enable terminal GOFF, a first electrode of the second transistor M2 is connected with a third power supply terminal VGL, and a second electrode of the second transistor M2 is connected with the line output terminal GOUT; a control electrode of the third transistor M3 is connected with a signal input terminal INPUT, a first electrode of the third transistor M3 is connected with a first power supply terminal CN, and a second electrode of the third transistor M3 is connected with a pull-up node PU; a control electrode of the fourth transistor M4 is connected with a reset terminal RESET, a first electrode of the fourth transistor M4 is connected with a second power supply terminal CNB, and a second electrode of the fourth transistor M4 is connected with the pull-up node PU; a control electrode of the fifth transistor M5 is connected with the pull-up node PU, a first electrode of the fifth transistor M5 is connected with a first clock signal terminal CK, and a second electrode of the fifth transistor M5 is connected with the signal output terminal OUT; one terminal of the first capacitor C1 is connected with the pull-up node PU, and the other terminal of the first capacitor C1 is connected with the signal output terminal OUT; a control electrode of the sixth transistor M6 is connected with a total reset terminal TRST, a first electrode of the sixth transistor M6 is connected with a third power supply terminal VGL, and a second electrode of the sixth transistor M6 is connected with the pull-up node PU; a control electrode of the seventh transistor M7 is connected with a pull-down node PD, a first electrode of the seventh transistor M7 is connected with the third power supply terminal VGL, and a second electrode of the seventh transistor M7 is connected with the pull-up node PU; a control electrode of the eighth transistor M8 is connected with the pull-up node PU, a first electrode of the eighth transistor M8 is connected with the third power supply terminal VGL, and a second electrode of the eighth transistor M8 is connected with the pull-down node PD; both a control electrode and a first electrode of the ninth transistor M9 are connected with a second clock signal terminal CKB, and a second electrode of the ninth transistor M9 is connected with the pull-down node PD; a control electrode of the tenth transistor M10 is connected with the pull-down node PD, a first electrode of the tenth transistor M10 is connected with the third power supply terminal VGL, and a second electrode of the tenth transistor M10 is connected with the signal output terminal OUT; a control electrode of the eleventh transistor M11 is connected with the signal output terminal OUT, a first electrode of the eleventh transistor M11 is connected with the third power supply terminal VGL, and a second electrode of the eleventh transistor M11 is connected with the pull-down node PD; one terminal of the second capacitor C2 is connected with the third power supply terminal VGL, and the other terminal of the second capacitor C2 is connected with the pull-down node PD.

FIG. 8 shows an exemplary structure of the input sub-circuit, the first reset sub-circuit, the intermediate output sub-circuit, the pull-down sub-circuit, the pull-down control sub-circuit, the second reset sub-circuit, the second output sub-circuit, and the transfer sub-circuit. Those skilled in the art may easily understand that implementations of the above sub-circuits are not limited to this as long as their functions can be achieved.

In this embodiment, the transistors M1 to M11 may all be N-type thin film transistors or P-type thin film transistors, such that process flows may be unified and process manufacturing procedures can be reduced, contributing to the improvement of the product yield. In addition, considering that a leakage current of a low-temperature polycrystalline silicon thin film transistor is small, all the transistors in the embodiments of the present disclosure may be low-temperature polycrystalline silicon thin film transistors. A thin film transistor may be selected as a thin film transistor with a bottom gate structure or a thin film transistor with a top gate structure as long as it can realize a switching function.

In an exemplary embodiment, the first capacitor C1 and the second capacitor C2 may be a liquid crystal capacitor composed of a pixel electrode and a common electrode, or may be an equivalent capacitor composed of a storage capacitor and a liquid crystal capacitor composed of a pixel electrode and a common electrode, and this is not restricted in the present disclosure.

The technical solution of an embodiment of the present disclosure will be described below through a working process of a shift register. The following describes a working process of a first shift register as an example.

Figure 9:
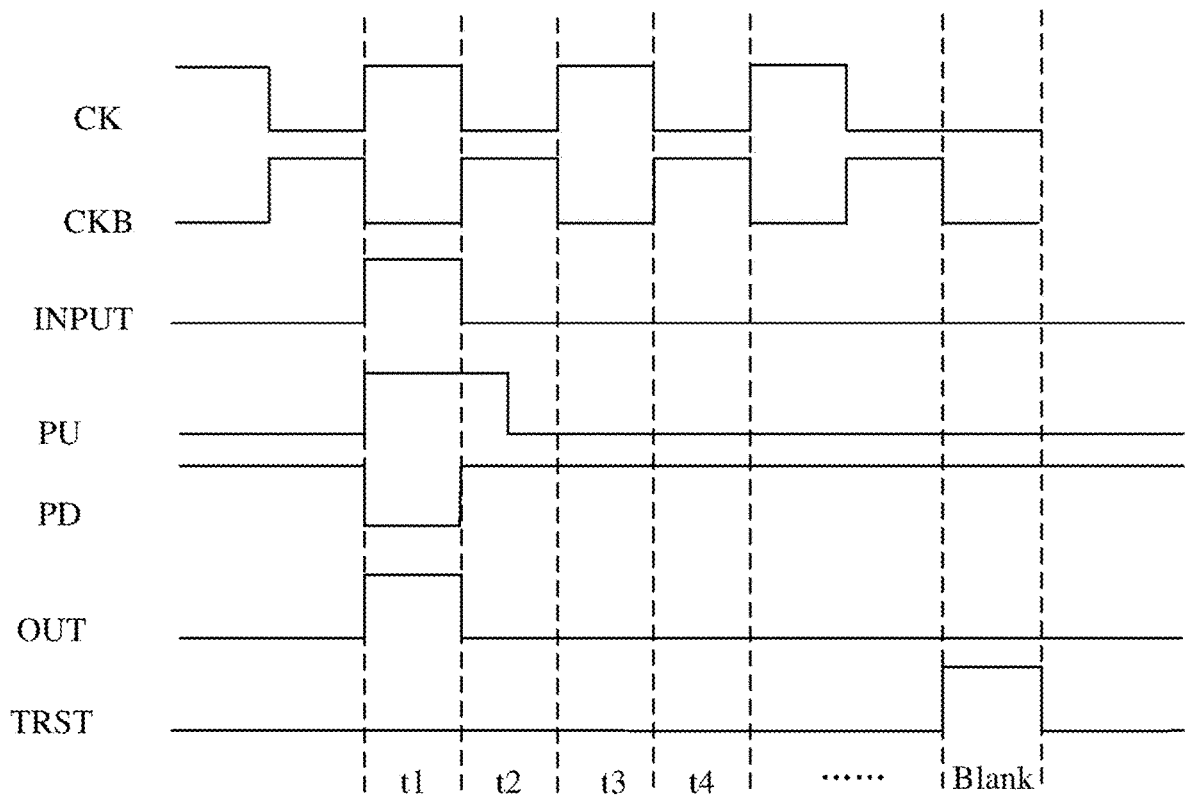
FIG. 9 is a work timing diagram of a shift register during a forward scanning according to the present disclosure.
Figure 10:
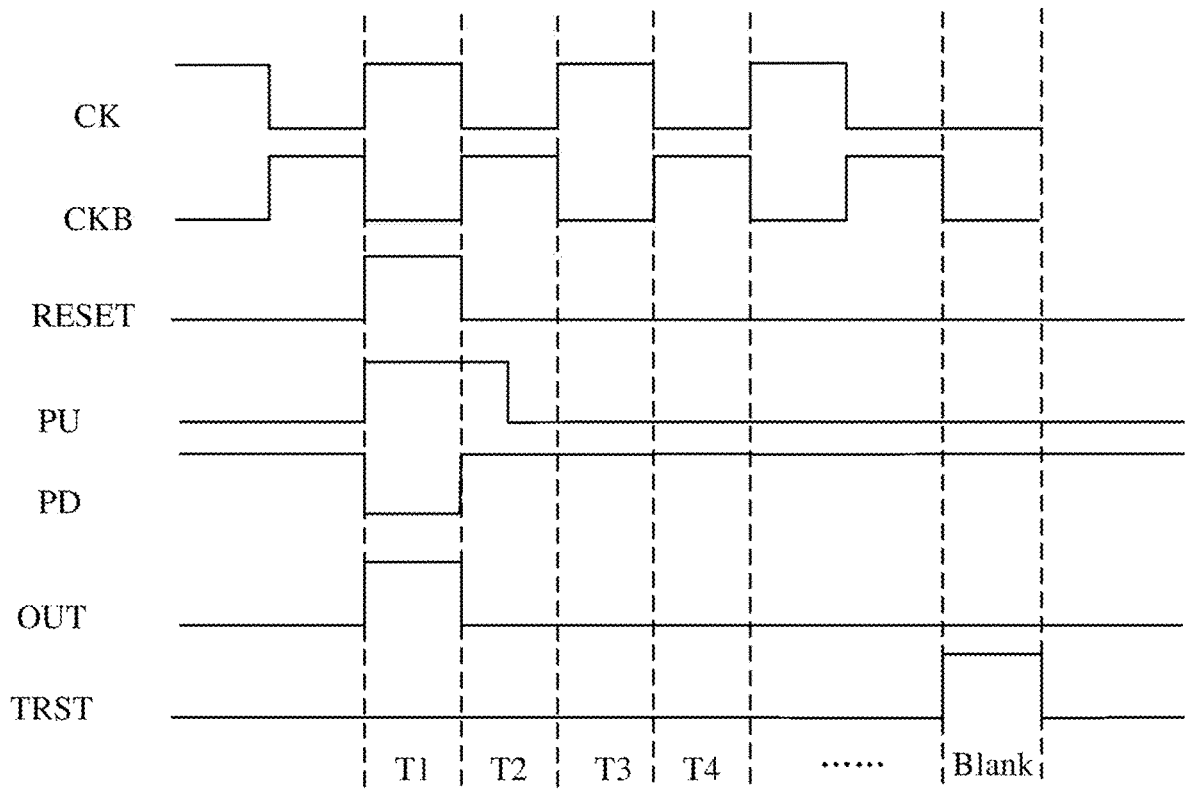
FIG. 10 is a work timing diagram of a shift register during a reverse scanning according to the present disclosure.

Taking the transistors M1 to M11 in the shift register according to the present disclosure being all N-type thin film transistors as an example, FIG. 9 is a work timing diagram of a shift register during a forward scanning according to an embodiment of the present disclosure, and FIG. 10 is a work timing diagram of a shift register during a reverse scanning backward according to an embodiment of the present disclosure. As shown in FIG. 8, FIG. 9 and FIG. 10, the shift register according to an embodiment of the present disclosure includes 11 transistor units (M1 to M11), 2 capacitor units (C1 to C2), 7 input terminals (INPUT, RESET, CK, CKB, TRST, GON and GOFF), 2 output terminals (OUT, GOUT) and 3 power supply terminals (CN, CNB and VGL), and the third power supply terminal VGL continuously provides a low-level signal.

During the forward scanning, the first power supply terminal CN inputs a high-level signal and the second power supply terminal CNB inputs a low-level signal. As shown in FIG. 9, a timing of the forward scanning includes the following stages.

At t1 stage, a signal input terminal INPUT of a shift register SRn inputs a high-level signal. Since a input signal of the signal input terminal INPUT of the shift register SRn is an output signal of a signal output terminal OUT of a previous shift register SRn−1, it can also be said that the high-level signal of the signal output terminal OUT of the previous shift register SRn−1 is input to the signal input terminal INPUT of the shift register SRn. Therefore, a third transistor M3 is turned on, and a first power supply terminal CN charges a first capacitor C1 through the third transistor M3, so that a potential of a pull-up node PU is pulled up to a high potential. Under the action of the high-level of the pull-up node PU, an eighth transistor M8 is turned on to pull down a level of a pull-down node PD with a third voltage signal VGL, and then a seventh transistor M7 and a tenth transistor M10 are turned off. A first clock signal CK is at a high-level. Under the action of the high-level of the pull-up node PU, a fifth transistor M5 is turned on to transmit the first clock signal CK to the signal output terminal OUT, and a high-level signal is output at this time. Under the action of the high-level of the signal output terminal OUT, an eleventh transistor M11 is turned on to pull down the level of the pull-down node PD with the third voltage signal VGL.

At this time, the shift register SRn may be at two stages: a scanning output stage or a scanning transfer stage. If the shift register SRn is at the scanning output stage, a line-OFF enable terminal GOFF of the shift register SRn inputs a low-level signal, a second transistor M2 is turned off, a line-ON enable terminal GON of the shift register SRn inputs a high-level signal, and a first transistor M1 is turned on, so that a signal of the signal output terminal OUT is output to a line output terminal GOUT.

If the shift register SRn is at the scanning transfer stage, the line-ON enable terminal GON of the shift register SRn inputs a low-level signal, the first transistor M1 is turned off, the line-OFF enable terminal GOFF of the shift register SRn inputs a high-level signal, and the second transistor M2 is turned on, to pull down the level of the line output terminal GOUT, so that the line output terminal GOUT has no output.

At t2 stage, the signal input terminal INPUT of the shift register SRn inputs a low-level signal, and the third transistor M3 is turned off. At this time, the first capacitor C1 discharges to keep the pull-up node PU at a high-level. The second clock signal CKB is at a high-level, and the ninth transistor M9 is turned on to transmit the second clock signal CKB to the pull-down node PD and charge the second capacitor C2, so the pull-down node PD is at a high-level. Under the action of the high-level of the pull-down node PD, the seventh transistor M7 is turned on to pull down the level of the pull-up node PU with the third voltage signal VGL, and then the fifth transistor M5 and the eighth transistor M8 are turned off. At the same time, the tenth transistor M10 is turned on, to pull down the level of the signal output terminal OUT with the third voltage signal VGL.

At t3 stage, the signal input terminal INPUT of the shift register SRn inputs a low-level signal, and the third transistor M3 is turned off. The second capacitor C2 discharges to keep the pull-down node PD at a high-level, the seventh transistor M7 is turned on to continuously pull down the level of the pull-up node PU. The fifth transistor M5 and the eighth transistor M8 are turned off, while the tenth transistor M10 is turned on to continuously pull down the level of the signal output terminal OUT, and the eleventh transistor M11 is turned off.

At t4 stage, the signal input terminal INPUT of the shift register SRn inputs a low-level signal, and the third transistor M3 is turned off. The second clock signal CKB is at a high-level, and the ninth transistor M9 is turned on to transmit the second clock signal CKB to the pull-down node PD and charge the second capacitor C2, so the pull-down node PD is at a high-level. Under the action of the high-level of the pull-down node PD, the seventh transistor M7 is turned on to pull down the level of the pull-up node PU with the third voltage signal VGL, and then the fifth transistor M5 and the eighth transistor M8 are turned off. At the same time, the tenth transistor M10 is turned on, to pull down the level of the signal output terminal OUT with the third voltage signal VGL.

At a blank stage, the signal input terminal INPUT of the shift register SRn inputs a low-level signal, and the first clock signal terminal CK and the second clock signal terminal CKB input low-level signals. At this time, a total reset terminal TRST inputs a high-level signal, the sixth transistor M6 is turned on, and the third voltage signal VGL is transmitted to the pull-up node PU through the sixth transistor M6 to keep it in a low-level state.

From the t4 stage to the blank stage, each shift register repeats the t3 stage and the t4 stage according to the actual situation until a signal output terminal OUT of a last shift register in a visuosensory area outputs a high-level signal or the signal output terminal OUT of the last shift register in a non-visuosensory area outputs a high-level signal.

At the blank stage, the total reset terminal TRST of the shift register SRn inputs a high-level signal, and the sixth transistor M6 is turned on, to pull down the pull-up nodes PU in all shift registers, and reset the shift registers of all lines, thereby improving the circuit stability.

During the reverse scanning, the first power supply terminal CN inputs a low-level signal, the second power supply terminal CNB inputs a high-level signal, and the reset terminal RESET is equivalent to the signal input terminal INPUT during the forward scanning, and the signal input terminal INPUT is equivalent to the reset terminal RESET during the forward scanning. As shown in FIG. 10, a timing of the reverse scanning includes the following stages.

At stage T1, the reset terminal RESET inputs a high-level signal. Since the input signal of the reset terminal RESET of the shift register SRn is the output signal of the signal output terminal OUT of a next shift register SRn+1, it can also be said that the high-level signal of the signal output terminal OUT of the next shift register SRn+1 is input to the reset terminal RESET of the shift register SRn, and then the fourth transistor M4 is turned on. The second power supply terminal CNB charges the first capacitor C1 through the fourth transistor M4, so that the potential of the pull-up node PU is pulled up to a high potential. Under the action of the high-level of the pull-up node PU, the eighth transistor M8 is turned on to pull down the level of the pull-down node PD with the third voltage signal VGL, and then the seventh transistor M7 and the tenth transistor M10 are turned off. The first clock signal CK is at a high-level. Under the action of the high-level of the pull-up node PU, the fifth transistor M5 is turned on to transmit the first clock signal CK to the signal output terminal OUT, and a high-level signal is output at this time. Under the action of the high-level of the signal output terminal OUT, the eleventh transistor M11 is turned on to pull down the level of the pull-down node PD with the third voltage signal VGL.

At this time, the shift register SRn may be at two stages: the scanning output stage or the scanning transfer stage. If the shift register SRn is at the scanning output stage, the line-OFF enable terminal GOFF of the shift register SRn inputs a low-level signal, the second transistor M2 is turned off, the line-ON enable terminal GON of the shift register SRn inputs a high-level signal, and the first transistor M1 is turned on, so that the signal of the signal output terminal OUT is output to the line output terminal GOUT.

If the shift register SRn is at the scanning transfer stage, the line-ON enable terminal GON of the shift register SRn inputs a low-level signal, the first transistor M1 is turned off, the line-OFF enable terminal GOFF of the shift register SRn inputs a high-level signal, and the second transistor M2 is turned on, to pull down the level of the line output terminal GOUT, so that the line output terminal GOUT has no output.

At T2 stage, the reset terminal RESET of the shift register SRn inputs a low-level signal, and the fourth transistor M4 is turned off. At this time, the first capacitor C1 discharges to keep the pull-up node PU at a high-level. The second clock signal CKB is at a high-level, and the ninth transistor M9 is turned on to transmit the second clock signal CKB to the pull-down node PD and charge the second capacitor C2, so the pull-down node PD is at a high-level. Under the action of the high-level of the pull-down node PD, the seventh transistor M7 is turned on to pull down the level of the pull-up node PU with the third voltage signal VGL, and then the fifth transistor M5 and the eighth transistor M8 are turned off. At the same time, the tenth transistor M10 is turned on, to pull down the level of the signal output terminal OUT with the third voltage signal VGL.

At T3 stage, the reset terminal RESET of the shift register SRn inputs a low-level signal, and the fourth transistor M4 is turned off. The second capacitor C2 discharges to keep the pull-down node PD at a high-level, the seventh transistor M7 is turned on to continuously pull down the level of the pull-up node PU, the fifth transistor M5 and the eighth transistor M8 are turned off, while the tenth transistor M10 is turned on to continuously pull down the level of the signal output terminal OUT, and the eleventh transistor M11 is turned off.

At T4 stage, the reset terminal RESET of the shift register SRn inputs a low-level signal, and the fourth transistor M4 is turned off. The second clock signal CKB is at a high-level, and the ninth transistor M9 is turned on to transmit the second clock signal CKB to the pull-down node PD and charge the second capacitor C2, so the pull-down node PD is at a high-level. Under the action of the high-level of the pull-down node PD, the seventh transistor M7 is turned on to pull down the level of the pull-up node PU with the third voltage signal VGL, and then the fifth transistor M5 and the eighth transistor M8 are turned off. At the same time, the tenth transistor M10 is turned on, to pull down the level of the signal output terminal OUT with the third voltage signal VGL.

At a blank stage, the reset terminal RESET of the shift register SRn inputs a low-level signal, and the first clock signal terminal CK and the second clock signal terminal CKB input low-level signals. At this time, the total reset terminal TRST inputs a high-level signal, the sixth transistor M6 is turned on, and the third voltage signal VGL is transmitted to the pull-up node PU through the sixth transistor M6 to keep it in a low-level state.

From the T4 stage to the blank stage, each shift register repeats the T3 stage and the T4 stage according to the actual situation until the signal output terminal OUT of the last shift register in the visuosensory area outputs a high-level signal or the signal output terminal OUT of the last shift register in the non-visuosensory area outputs a high-level signal.

At the blank stage, the total reset terminal TRST of the shift register SRn inputs a high-level signal, and the sixth transistor M6 is turned on, to pull down the pull-up nodes PU in all shift registers, reset the shift registers of all lines, thereby improving the circuit stability.

The connection modes of each transistor of the shift register during the forward scanning and the reverse scanning are the same, except that the output level signals of the first power supply terminal CN and the second power supply terminal CNB are different, which includes: when the shift register performs the forward scanning, the first power supply terminal CN outputs a high-level signal and the second power supply terminal CNB outputs a low-level signal; when the shift register performs the reverse scanning, the first power supply terminal CN outputs a low-level signal and the second power supply terminal CNB outputs a high-level signal. The third power supply terminal VGL outputs a low-level signal VGL when the shift register performs the forward scanning and the reverse scanning.

Some embodiments of the present disclosure also provide a driving method for a shift register, which is applied to the shift register according to the previous embodiments. The shift register includes a first output sub-circuit, a second output sub-circuit and a transfer sub-circuit. FIG. 11 is a flowchart of a driving method for a shift register during a forward scanning according to an embodiment of the present disclosure. As shown in FIG. 11, the driving method includes acts 100 to 101 during the forward scanning.

At act 100, at a scanning transfer stage, a first output sub-circuit provides a signal of a first power supply terminal to a pull-up node under the control of a signal input terminal, and outputs a signal of a first clock signal terminal to a signal output terminal according to a level of the pull-up node; a transfer sub-circuit pulls down a signal of a line output terminal under the control of a line-OFF enable signal; the first output sub-circuit transmits a signal of a second clock signal terminal to a pull-down node under the control of the second clock signal terminal, and pulls down a level of the signal output terminal according to a level of the pull-down node.

In an exemplary embodiment, when the shift register performs the forward scanning, the first power supply terminal outputs a high-level signal, and input signals of the first clock signal terminal and the second clock signal terminal are both pulse signals, which are alternately triggered to control the transfer and reset of each shift register one by one.

At act 101, at a scanning output stage, the first output sub-circuit provides the signal of the first power supply terminal to the pull-up node under the control of the signal input terminal, and outputs the signal of the first clock signal terminal to the signal output terminal according to the level of the pull-up node; the second output sub-circuit outputs the signal of the signal output terminal to the line output terminal under the control of the line-ON enable signal; the first output sub-circuit transmits the signal of the second clock signal terminal to the pull-down node under the control of the second clock signal terminal, and pulls down the level of the signal output terminal according to the level of the pull-down node.

In an exemplary embodiment, a frequency of an input signal of the first clock signal terminal and a frequency of an input signal of the second clock signal terminal at the scanning transfer stage are the same; a frequency of an input signal of the first clock signal terminal and a frequency of an input signal of the second clock signal terminal at the scanning output stage are the same, and the frequency of the input signal of the first clock signal terminal or the frequency of the input signal of the second clock signal terminal at the scanning output stage is less than the frequency of the input signal of the first clock signal terminal or the frequency of the input signal of the second clock signal terminal at the scanning transfer stage.

In an exemplary embodiment, the driving method further includes: at the scanning blank stage, the first output sub-circuit resets pull-up nodes of all shift registers under the control of the total reset terminal.

FIG. 12 is a flowchart of a driving method for a shift register during a reverse scanning according to an embodiment of the present disclosure. As shown in FIG. 12, the driving method includes acts 102 to 103 during the reverse scanning.

At act 102, at a scanning transfer stage, a first output sub-circuit provides a signal of a second power supply terminal to a pull-up node under the control of a reset terminal, and outputs a signal of the first clock signal terminal to a signal output terminal according to a level of the pull-up node; a transfer sub-circuit pulls down a signal of a line output terminal under the control of a line-OFF enable signal; the first output sub-circuit transmits a signal of a second clock signal terminal to a pull-down node under the control of the second clock signal terminal, and pulls down a level of the signal output terminal according to a level of the pull-down node.

In an exemplary embodiment, the second power supply terminal outputs a high-level signal when the shift register performs the reverse scanning, and the input signals of the first clock signal terminal and the second clock signal terminal are both pulse signals, which are alternately triggered to control the transfer and reset of each shift register one by one.

At act 103, at a scanning output stage, the first output sub-circuit provides the signal of the second power supply terminal to the pull-up node under the control of the reset terminal, and outputs the signal of the first clock signal terminal to the signal output terminal according to the level of the pull-up node; the second output sub-circuit outputs the signal of the signal output terminal to the line output terminal under the control of the line-ON enable signal; and the first output sub-circuit transmits the signal of the second clock signal terminal to the pull-down node under the control of the second clock signal terminal, and pulls down the level of the signal output terminal according to the level of the pull-down node.

In an exemplary embodiment, a frequency of an input signal of the first clock signal terminal and a frequency of an input signal of the second clock signal terminal at the scanning transfer stage are the same; a frequency of an input signal of the first clock signal terminal and a frequency of an input signal of the second clock signal terminal at the scanning output stage are the same, and the frequency of the input signal of the first clock signal terminal or the frequency of the input signal of the second clock signal terminal at the scanning output stage is less than the frequency of the input signal of the first clock signal terminal or the frequency of the input signal of the second clock signal terminal at the scanning transfer stage.

In an exemplary embodiment, the driving method further includes: at the scanning blank stage, the first output sub-circuit resets pull-up nodes of all shift registers under the control of the total reset terminal.

According to the driving method for the shift register according to the present disclosure, the second output sub-circuit outputs the signal of the signal output terminal to the line output terminal under the control of the line-ON enable terminal at the scanning output stage, and the transfer sub-circuit pulls down the level of the line output terminal under the control of the line-OFF enable terminal at the scanning transfer stage, so as to refresh and display the visuosensory area quickly switched by the user immediately and render the image information focused by the user at a high speed, thereby providing solutions to the problems of dynamic blur, ghosting etc. in conventional display, and providing the user with a good visual experience.

Figure 13:
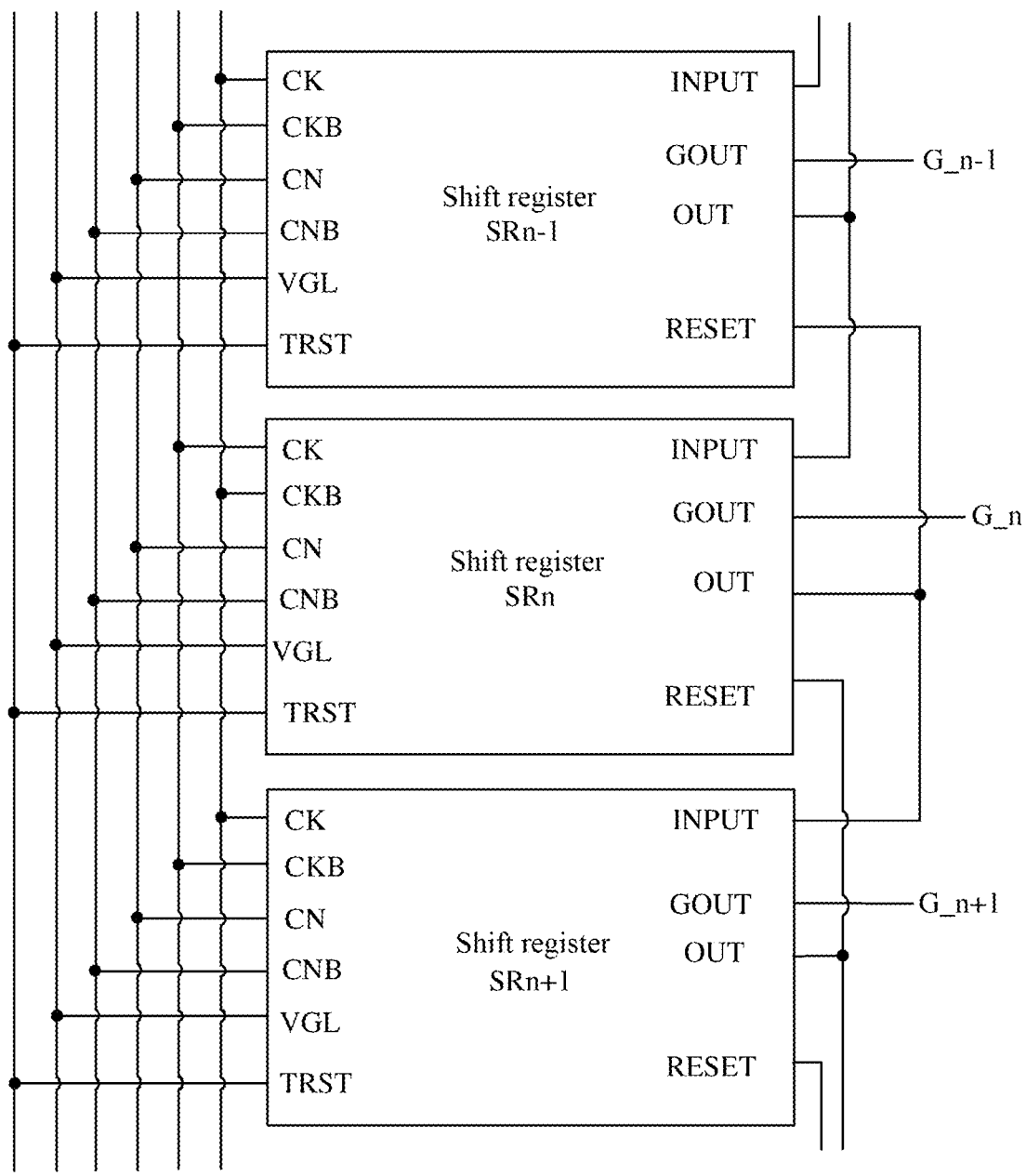
FIG. 13 is a schematic diagram of a structure of a gate drive circuit according to the present disclosure.

In an exemplary embodiment, the present disclosure also provides a gate drive circuit. FIG. 13 is a schematic diagram of a structure of a gate drive circuit according to an embodiment of the present disclosure. As shown in FIG. 13, the gate drive circuit includes multiple cascaded shift registers, and the connection modes of a first clock signal terminal CK and a second clock signal terminal CKB of each shift register with two external clock control signals are exchanged one by one, a line output terminal of each shift register is connected with a gate line for driving the gate line.

In this gate drive circuit, except a last shift register, a signal output terminal of each shift register is connected with a signal input terminal of a next shift register. Of course, the signal input terminal of a first shift register needs to be connected with a separate drive signal, and except the first shift register, the signal output terminal of each shift register is also connected with a reset terminal of a previous shift register. Of course, a reset terminal of the last shift register is connected with a separate drive signal.

The shift register is the shift register according to any one of the aforementioned embodiments and has similar implementation principle and implementation effect which will not be described in detail here again.

Figure 14:
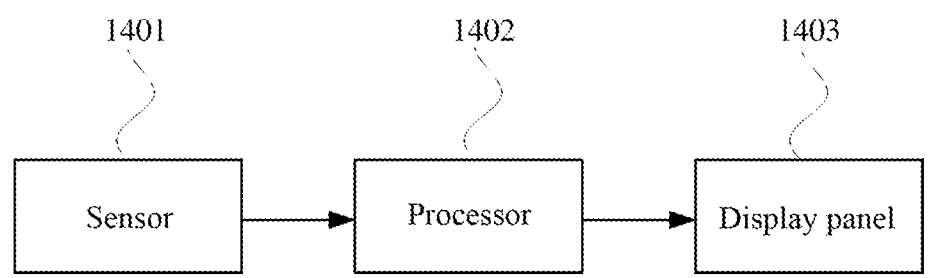
FIG. 14 is a schematic diagram of a structure of a display device according to the present disclosure.

In an exemplary embodiment, the present disclosure also provides a display device. FIG. 14 is a schematic diagram of a structure of a display device according to the present disclosure. As shown in FIG. 14, the display device includes a sensor 1401, a processor 1402 and a display panel 1403. The display panel 1403 includes a gate drive circuit, the gate drive circuit is the gate drive circuit according to any one of the aforementioned embodiments and has similar implementation principle and implementation effect which will not be described in detail here again.

The sensor 1401 is configured to identify a position of a user's visuosensory area and transmit the identified position of the visuosensory area to the processor 1402.

The processor 1402 is configured to detect whether the position of the visuosensory area at a current moment is the same as the position of the visuosensory area at a previous moment, calculate a number of scanning lines corresponding to the position of the visuosensory area at the current moment if the position of the visuosensory area at the current moment is different from the position of the visuosensory area at the previous moment, and update a driving timing of the gate drive circuit according to the calculated number of scanning lines corresponding to the position of the visuosensory area.

In an exemplary embodiment, it is assumed that scanning lines corresponding to the position of the visuosensory area at the current moment are the n-th to the m-th lines, where N is a total number of scanning lines, where n is a natural number greater than or equal to 1, and m is a natural number greater than n and less than or equal to N. Then the driving timing of the gate drive circuit includes a sub-frame transmission stage of the visuosensory area and a sub-frame transmission stage of the non-visuosensory area, the sub-frame transmission stage of the visuosensory area includes a scanning transfer stage of the non-visuosensory area and a scanning output stage of the visuosensory area, and the sub-frame transmission stage of the non-visuosensory area includes a first scanning output stage of the non-visuosensory area, a scanning transfer stage of the visuosensory area and a second scanning output stage of the non-visuosensory area.

During the forward scanning, at the scanning transfer stage of the non-visuosensory area, shift registers of scanning lines before an n-th line are enabled to transfer a signal of a signal output terminal line by line at a first frequency.

At the scanning output stage of the visuosensory area, shift registers from the n-th line to an m-th line are enabled to output a signal of a line output terminal line by line at a second frequency, and the second frequency is less than the first frequency.

At the first scanning output stage of the non-visuosensory area, the shift registers of scanning lines before the n-th line are enabled to output the signal of the line output terminal line by line at the second frequency.

At the scanning transfer stage of the visuosensory area, shift registers from the n-th line to the m-th line are enabled to transfer the signal of the signal output terminal line by line at the first frequency.

At the second scanning output stage of the non-visuosensory area, shift registers of scanning lines after the m-th line are enabled to output the signal of the line output terminal line by line at the second frequency.

During the reverse scanning, at the scanning transfer stage of the non-visuosensory area, the shift registers of scanning lines after the m-th line are enabled to transfer the signal of the signal output terminal line by line at the first frequency.

At the scanning output stage of the visuosensory area, shift registers from the n-th line to the m-th line are enabled to output the signal of the line output terminal line by line at the second frequency.

At the first scanning output stage of the non-visuosensory area, the shift registers of scanning lines after the m-th line are enabled to output the signal of the line output terminal line by line at the second frequency.

At the scanning transfer stage of the visuosensory area, shift registers from the n-th line to the m-th line are enabled to transfer the signal of the signal output terminal line by line at the first frequency.

At the second scanning output stage of the non-visuosensory area, the shift registers of scanning lines before the n-th line are enabled to output the signal of the line output terminal line by line at the second frequency.

Figure 15:
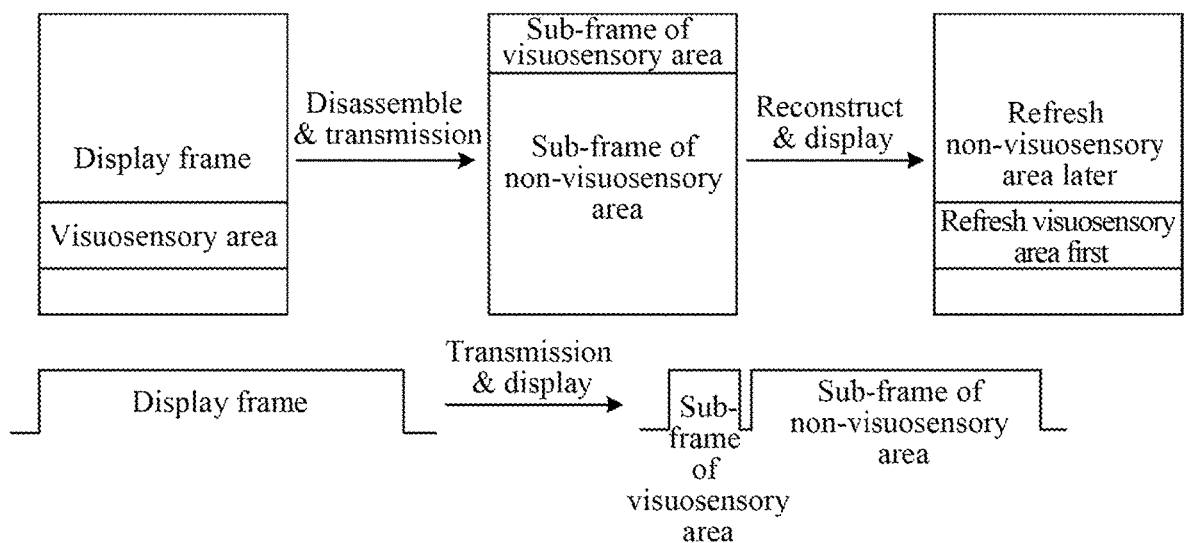
FIG. 15 is a schematic diagram of a display frame transmission principle according to the present disclosure.

Based on the characteristic of the fast scanning transfer and slow scanning output of the shift register according to an embodiment of the present disclosure, the present disclosure proposes an ultra-high speed switching refresh solution of an image of the visuosensory area. As shown in FIG. 15, according to the position of the visuosensory area quickly switched by the user on the display device, the display frame image is disassembled into an sub-frame image of the visuosensory area and an sub-frame image of the non-visuosensory area with the same frequency, and through a corresponding driving timing, on the premise of a display frequency being unchanged, sub-frame image data of the visuosensory area is first transmitted and refreshed at a first stage, and then the sub-frame image of the non-visuosensory area is transmitted and refreshed at a second stage.

In an exemplary embodiment, the driving timing of the gate drive circuit further includes a scanning blank stage between the scanning output stage of the visuosensory area and the first scanning output stage of the non-visuosensory area, and after the second scanning output stage of the non-visuosensory area.

The scanning blank stage is used to pull down levels of pull-up nodes in all shift registers and reset the shift registers of all lines.

A technical solution of an embodiment of the present disclosure is described below by a driving process of a gate drive circuit. For example, the n-th line to the m-th line (totaling 8k lines) are taken as the visuosensory area and it is the forward scanning (n>1, m>n, N=8k), the ultra-high speed switching and refreshing solution of the image of the visuosensory area is explained as follows.

A refreshing stage of sub-frames of the visuosensory area: G_1 to G_n−1 lines are the non-visuosensory area, and each shift register corresponding to it works in a scanning transfer mode. G_n to G_m lines are the visuosensory area, and each shift register corresponding to it works in a scanning output mode. G_m+1 to G_8k lines are the non-visuosensory area, and shift registers may not perform the transfer to save time (in other embodiments, shift registers may perform the scanning and transfer).

A refreshing stage of sub-frames of the non-visuosensory area: G_1 to G_n−1 lines are the non-visuosensory area, and each shift register corresponding to it works in the scanning output mode. G_n to G_m lines are the visuosensory area, and each shift register corresponding to it works in the scanning transfer mode. G_m+1 to G_8k lines are the non-visuosensory area, and each shift register corresponding to it works in the scanning output mode.

Figure 16:
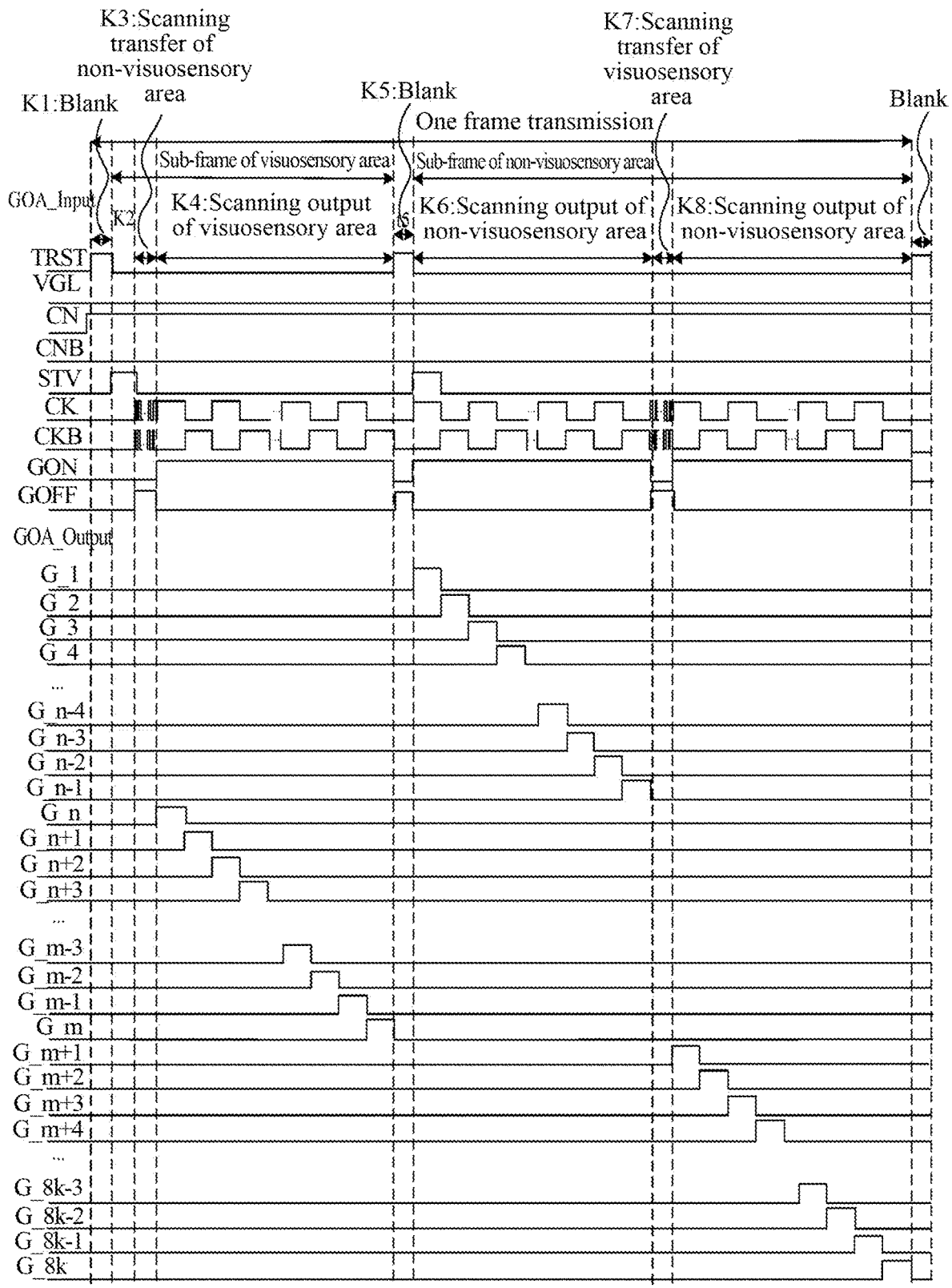
FIG. 16 is a work timing diagram of a gate drive circuit during a forward scanning according to the present disclosure.

As shown in FIG. 16, within one frame transmission time, a driving process of a gate drive circuit includes the following stages.

At K1 stage, it is a global reset stage before the start of frame. A total reset terminal TRST is pulled up, a first power supply terminal CN is kept at a high-level, and other signals are kept at a low-level. A high-level signal of the total reset terminal TRST turns on a sixth transistor M6 of each shift register, pulls down a potential of a pull-up node PU of each shift register, and discharges a first capacitor C1 to a low voltage VGL, keeps a fifth transistor M5 off for a global reset.

At K2 stage, the total reset terminal TRST is pulled down, the sixth transistor M6 is turned off and the global reset is stopped. A frame start signal STV is pulled up, a third transistor M3 of a first shift register is turned on. A high-level signal of a first power supply terminal CN charges the first capacitor C1 and turns on a fifth transistor M5. At this time, a signal input from a first clock terminal CK is at a low-level, and a signal output terminal OUT_1 of the first shift register has no high-level output.

At K3 stage, the frame start signal STV is pulled down, the third transistor M3 is turned off, and the fifth transistor M5 is kept ON under the control of the first capacitor C1. A line-OFF enable terminal GOFF is pulled up and a second transistor M2 is turned on, so that line output terminals GOUT_1 to GOUT_n−1 of each shift register have no output. The first clock signal CK and a second clock signal CKB alternately provide clock signals to each shift register at a high frequency, and the signal output terminals OUT_1 to OUT_n−1 of each shift register perform output subsequently, so that a shift register in the non-visuosensory area performs the fast scanning transfer without line scanning output.

At K4 stage, when the signal is transferred to a range of the n-th to the m-th shift registers corresponding to the visuosensory area, the line-OFF enable terminal GOFF is pulled down, the second transistor M2 is turned off, the line-ON enable terminal GON is pulled up, and the first transistor M1 is turned on, so that the signal output terminals OUT_n to OUT_m of each shift register are connected and output to the line output terminals GOUT_n to GOUT_m respectively, and clock frequencies of the first clock signal CK and the second clock signal CKB are greatly reduced, so that shift registers corresponding to the visuosensory area perform slow scanning output.

At K5 stage, the line-ON enable terminal GON is pulled down, the first transistor M1 is turned off, the line-OFF enable terminal GOFF is pulled up, the second transistor M2 is turned on, and the first clock signal CK and the second clock signal CKB are pulled down, so that a scanning output lines of each shift register are reset to a low-level signal. And the total reset terminal TRST is pulled up, and the sixth transistor M6 is turned on for the global reset.

At K6 stage, it is a scanning output stage of the first to the (n−1)-th shift registers corresponding to the non-visuosensory area. The line-OFF enable terminal GOFF is pulled down and the second transistor M2 is turned off, the line-ON enable terminal GON is pulled up and the first transistor M1 is turned on, so that the signal output terminals OUT_1 to OUT_n−1 of each shift register are connected and output to the line output terminals GOUT_1 to GOUT_n−1 respectively. The frame start signal STV is pulled up, the third transistor M3 of the first shift register is turned on (STV is only pulled up by one clock width). The high-level signal of the first power supply terminal CN charges the first capacitor C1 and turns on the fifth transistor M5, and the first clock signal CK and the second clock signal CKB alternately provide clock signals to each shift register at a low frequency, so that the first to the (n−1)-th shift registers corresponding to the non-visuosensory area perform the slow scanning output.

At K7 stage, it is the scanning transfer stage of the n-th to the m-th shift registers corresponding to the visuosensory area, G_n to G_m lines have no output. The control timing for shift registers is similar to that in K3 stage, so it will not be repeated here.

At K8 stage, it is the scanning output stage of the (m+1)-th to the 8K-th shift registers corresponding to the non-visuosensory area (in this embodiment, a resolution of 8K is taken as an example, and N may be other values, which is not limited by the present disclosure), and the line output terminals G_m+1 to G_8K perform output one by one. The control timing for shift registers is similar to that in K4 stage, so it will not be repeated here.

According to the present disclosure, a unique shift register cascade mode is used to construct a gate drive circuit with ultra-high speed transfer of any number of nodes, and with a unique control timing, the fixed shift register cascade circuit may simultaneously have two working modes of scanning transfer and scanning output. Using these two working modes, an embodiment of the present disclosure provides an ultra-high speed switching and refreshing solution of the image of the visuosensory area. On the premise of not increasing the display refresh frequency, the display frame images are disassembled into sub-frames of the visuosensory area and sub-frames of the non-visuosensory area with the same frequency. According to the position of the visuosensory area quickly switched by the user on the display device, sub-frame images of the visuosensory area are transmitted and refreshed immediately, and the image information focused by the user is rendered at high speed. Therefore, the display refresh frequency is not increased, and solutions are provided to solve the problems of dynamic blur, ghosting etc. in conventional display, and providing the user with a good visual experience.

In the scanning transfer mode, the line-ON enable terminal GON is pulled down, the first transistor M1 is turned off, the line-OFF enable terminal GOFF is pulled up, the second transistor M2 is turned on, and the line output terminal GOUT is connected with a low-level signal and disconnected from each shift register. Each of cascaded shift registers is not loaded with large Gate Line Loading, and the cascade transfer of ultra-high speed shift register is performed under the ultra-low load. At this time, each of cascaded shift registers only performs the fast scanning transfer, and does not scan and drive display lines.

In the scanning output mode, the line-ON enable terminal GON is pulled up, the first transistor M1 is turned on, the line-OFF enable terminal GOFF is pulled down, the second transistor M2 is turned off, and the gate line loading is connected with each shift register circuit. Each of cascaded shift registers scans and drives, with low speed, each pixel line through the line output terminal under the large gate line loading, and the signal output terminal transfers, with low speed, and resets the shift register. Each shift register transfers, with low speed, and scans, line by line, and drives the display lines.

Figure 17:
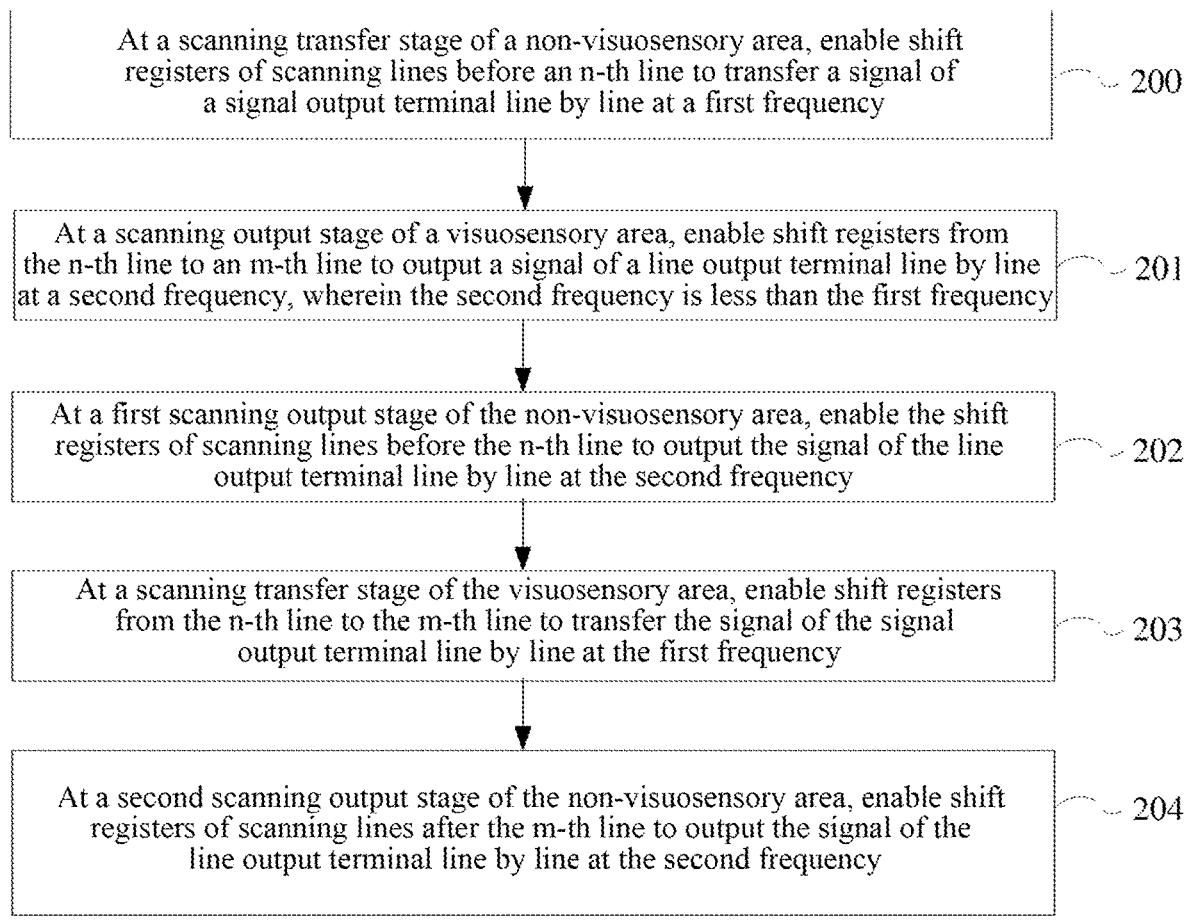
FIG. 17 is a flowchart of a driving method for a gate drive circuit according to the present disclosure.

An embodiment of the present disclosure also provides a driving method for a gate drive circuit. FIG. 17 is a flowchart of a driving method for a gate drive circuit according to an embodiment of the present disclosure. As shown in FIG. 17, the driving method includes acts 200 to 204 during a forward scanning.

At act 200, at a scanning transfer stage of a non-visuosensory area, shift registers of scanning lines before an n-th line are enabled to transfer a signal of a signal output terminal line by line at a first frequency.

At act 201, at a scanning output stage of a visuosensory area, shift registers from the n-th line to an m-th line are enabled to output a signal of a line output terminal line by line at a second frequency, wherein the second frequency is less than the first frequency.

At act 202, at a first scanning output stage of the non-visuosensory area, the shift registers of scanning lines before the n-th line are enabled to output the signal of the line output terminal line by line at the second frequency.

At act 203, at a scanning transfer stage of the visuosensory area, the shift registers from the n-th line to the m-th line are enabled to transfer the signal of the signal output terminal line by line at the first frequency.

At act 204, at a second scanning output stage of the non-visuosensory area, shift registers of scanning lines after the m-th line are enabled to output the signal of the line output terminal line by line at the second frequency, wherein n is a natural number greater than or equal to 1, m is a natural number greater than n and less than or equal to N, and N is a total number of scanning lines.

In an exemplary embodiment, as shown in FIG. 18, the driving method includes acts 205 to 209 during a reverse scanning.

At act 205, at the scanning transfer stage of the non-visuosensory area, the shift registers of scanning lines after the m-th line are enabled to transfer the signal of the signal output terminal line by line at the first frequency.

At act 206, at the scanning output stage of the visuosensory area, the shift registers from the n-th line to the m-th line are enabled to output the signal of the line output terminal line by line at the second frequency.

At act 207, at the first scanning output stage of the non-visuosensory area, the shift registers of scanning lines after the m-th line are enabled to output the signal of the line output terminal line by line at the second frequency.

At act 208, at the scanning transfer stage of the visuosensory area, the shift registers from the n-th line to the m-th line are enabled to transfer the signal of the signal output terminal line by line at the first frequency.

At act 209, at the second scanning output stage of the non-visuosensory area, the shift registers of scanning lines before the n-th line are enabled to output the signal of the line output terminal line by line at the second frequency.

In an exemplary embodiment, the driving method for the gate drive circuit further includes a scanning blank stage between the scanning output stage of the visuosensory area and the first scanning output stage of the non-visuosensory area, and after the second scanning output stage of the non-visuosensory area.

In the scanning blank stage, the levels of pull-up nodes in all shift registers are pulled down, to reset the shift registers of all lines.

The drawings of the embodiments of the present disclosure only relate to the structures involved in the embodiments of the present disclosure, and the other structures may refer to conventional designs.

Although the implementations of the present disclosure are disclosed above, the contents are only implementations adopted for easily understanding the present disclosure and not intended to limit the present disclosure. Those skilled in the art may make any modifications and variations to implementation forms and details without departing from the spirit and scope disclosed by the present disclosure. However, the scope of patent protection of the present disclosure should also be subject to the scope defined by the appended claims.

The invention claimed is:

1. A shift register, comprising: a first output sub-circuit, a second output sub-circuit and a transfer sub-circuit, wherein the shift register comprises a signal output terminal and a line output terminal, the signal output terminal being connected with the first output sub-circuit and the second output sub-circuit, and the line output terminal being connected with the second sub-circuit and the transfer sub-circuit; wherein the line output terminal is connected with a pixel line, and the signal output terminal is not connected with the pixel line, only transfer and reset of shift register is performed;

the first output sub-circuit is configured to provide a signal of a first power supply terminal or a second power supply terminal to a pull-up node under control of a signal input terminal or a reset terminal, and output a signal of a first clock signal terminal to the signal output terminal according to a level of the pull-up node; transmit a signal of a second clock signal terminal to a pull-down node under control of the second clock signal terminal, and pull down a level of the signal output terminal according to a level of the pull-down node;

wherein the shift register is adapted to a visuosensory area with a plurality of scanning lines and a non-visuosensory area with a plurality of scanning lines; the second output sub-circuit is configured to output a signal of the signal output terminal to the line output terminal under control of a line-ON enable signal at a scanning output stage of the visuosensory area and a scanning output stage of the non-visuosensory area; and the transfer sub-circuit is configured to pull down a level of the line output terminal under control of a line-OFF enable signal at a scanning transfer stage of the visuosensory area and a scanning transfer stage of the non-visuosensory area;

wherein the second output sub-circuit comprises a first transistor, a control electrode of the first transistor being connected with the line-ON enable terminal, a first electrode of the first transistor being connected with the signal output terminal, and a second electrode of the first transistor being connected with the line output terminal; and wherein the transfer sub-circuit comprises a second transistor, a control electrode of the second transistor being connected with the line-OFF enable terminal, a first electrode of the second transistor being connected with a third power supply terminal, and a second electrode of the second transistor being connected with the line output terminal;

wherein the first output sub-circuit comprises an input sub-circuit, and an intermediate output sub-circuit, the input sub-circuit being configured to provide the signal of the first power supply terminal to the pull-up node under control of the signal input terminal, and the intermediate output sub-circuit being configured to output the signal of the first clock signal terminal to the signal output terminal according to the level of the pull-up node;

wherein the intermediate output sub-circuit comprises a fifth transistor and a first capacitor, wherein:

a control electrode of the fifth transistor is connected with the pull-up node, a first electrode of the fifth transistor is connected with the first clock signal terminal, and a second electrode of the fifth transistor is connected with the signal output terminal;

one terminal of the first capacitor is connected with the pull-up node, and the other terminal of the first capacitor is connected with the signal output terminal.

2. The shift register according to claim 1, wherein a frequency of an input signal of the first clock signal terminal and a frequency of an input signal of the second clock signal terminal of the first output sub-circuit at the scanning transfer stage are the same; a frequency of an input signal of the first clock signal terminal and a frequency of an input signal of the second clock signal terminal of the first output sub-circuit at the scanning output stage are the same, and the frequency of the input signal of the first clock signal terminal or the frequency of the input signal of the second clock signal terminal at the scanning output stage is less than the frequency of the input signal of the first clock signal terminal or the frequency of the input signal of the second clock signal terminal at the scanning transfer stage.

3. A gate drive circuit, comprising a plurality of cascaded shift registers according to claim 2.

4. The shift register according to claim 1, wherein the first output sub-circuit further comprises a first reset sub-circuit, a pull-down sub-circuit, a pull-down control sub-circuit, and a second reset sub-circuit, and wherein:
the first reset sub-circuit is configured to provide the signal of the second power supply terminal to the pull-up node under control of the reset terminal;
the pull-down control sub-circuit is configured to pull down the level of the pull-down node according to the level of the pull-up node; transmit the signal of the second clock signal terminal to the pull-down node under control of the second clock signal terminal, and pull down the level of the pull-up node according to the level of the pull-down node;
the pull-down sub-circuit is configured to pull down the level of the pull-down node according to the level of the signal output terminal; pull down the level of the signal output terminal according to the level of the pull-down node; and
the second reset sub-circuit is configured to reset the pull-up node under control of a total reset terminal.

5. The shift register according to claim 4, wherein the second reset sub-circuit comprises a sixth transistor, and wherein:
a control electrode of the sixth transistor is connected with the total reset terminal, a first electrode of the sixth transistor is connected with a third power supply terminal, and a second electrode of the sixth transistor is connected with the pull-up node.

6. The shift register according to claim 4, wherein the pull-down control sub-circuit comprises: a seventh transistor, an eighth transistor, and a ninth transistor, and the pull-down sub-circuit comprises: a tenth transistor, an eleventh transistor, and a second capacitor, and wherein:
a control electrode of the seventh transistor is connected with the pull-down node, a first electrode of the seventh transistor is connected with a third power supply terminal, and a second electrode of the seventh transistor is connected with the pull-up node;
a control electrode of the eighth transistor is connected with the pull-up node, a first electrode of the eighth transistor is connected with the third power supply terminal, and a second electrode of the eighth transistor is connected with the pull-down node;
both a control electrode and a first electrode of the ninth transistor are connected with the second clock signal terminal, and a second electrode of the ninth transistor is connected with the pull-down node;
a control electrode of the tenth transistor is connected with the pull-down node, a first electrode of the tenth transistor is connected with the third power supply terminal, a second electrode of the tenth transistor is connected with the signal output terminal;
a control electrode of the eleventh transistor is connected with the signal output terminal, a first electrode of the eleventh transistor is connected with the third power supply terminal, and a second electrode of the eleventh transistor is connected with the pull-down node; and
one terminal of the second capacitor is connected with the third power supply terminal, and the other terminal of the second capacitor is connected with the pull-down node.

7. The shift register according to claim 1, wherein the input sub-circuit comprises: a third transistor, and the first reset sub-circuit comprises: a fourth transistor, and wherein:
a control electrode of the third transistor is connected with the signal input terminal, a first electrode of the third transistor is connected with the first power supply terminal, and a second electrode of the third transistor is connected with the pull-up node; and
a control electrode of the fourth transistor is connected with the reset terminal, a first electrode of the fourth transistor is connected with the second power supply terminal, and a second electrode of the fourth transistor is connected with the pull-up node.

8. The shift register according to claim 1, wherein the first output sub-circuit further comprises a third transistor, a fourth transistor, a sixth transistor, a seventh transistor, an eighth transistor, a ninth transistor, a tenth transistor, an eleventh transistor and a second capacitor, and wherein:
a control electrode of the third transistor is connected with the signal input terminal, a first electrode of the third transistor is connected with the first power supply terminal, and a second electrode of the third transistor is connected with the pull-up node;
a control electrode of the fourth transistor is connected with the reset terminal, a first electrode of the fourth transistor is connected with the second power supply terminal, and a second electrode of the fourth transistor is connected with the pull-up node;
a control electrode of the sixth transistor is connected with a total reset terminal, a first electrode of the sixth transistor is connected with the third power supply terminal, and a second electrode of the sixth transistor is connected with the pull-up node;
a control electrode of the seventh transistor is connected with the pull-down node, a first electrode of the seventh transistor is connected with the third power supply terminal, and a second electrode of the seventh transistor is connected with the pull-up node;
a control electrode of the eighth transistor is connected with the pull-up node, a first electrode of the eighth transistor is connected with the third power supply terminal, and a second electrode of the eighth transistor is connected with the pull-down node;
both a control electrode and a first electrode of the ninth transistor are connected with the second clock signal terminal, and a second electrode of the ninth transistor is connected with the pull-down node;
a control electrode of the tenth transistor is connected with the pull-down node, a first electrode of the tenth transistor is connected with the third power supply terminal, a second electrode of the tenth transistor is connected with the signal output terminal;
a control electrode of the eleventh transistor is connected with the signal output terminal, a first electrode of the eleventh transistor is connected with the third power supply terminal, and a second electrode of the eleventh transistor is connected with the pull-down node; and one terminal of the second capacitor is connected with the third power supply terminal, and the other terminal of the second capacitor is connected with the pull-down node.

9. A gate drive circuit, comprising a plurality of cascaded shift registers according to claim 1.

10. A display device, comprising: a sensor, a processor and a display panel, the display panel comprising the gate drive circuit according to claim 9, wherein:
the sensor is configured to identify a position of a user's visuosensory area and transmit the identified position of the visuosensory area to the processor; and
the processor is configured to detect whether the position of the visuosensory area at a current moment is the same as the position of the visuosensory area at a previous moment, calculate a number of scanning lines corresponding to the position of the visuosensory area at the current moment if the position of the visuosensory area at the current moment is different from the position of the visuosensory area at the previous moment, and update a driving timing of the gate drive circuit according to the calculated number of scanning lines corresponding to the position of the visuosensory area.

11. A driving method for a gate drive circuit, applied to the display device of claim 10, comprising, during a forward scanning:
at a scanning transfer stage of a non-visuosensory area, enabling shift registers of scanning lines before an n-th line to transfer a signal of a signal output terminal line by line at a first frequency;
at a scanning output stage of a visuosensory area, enabling shift registers from the n-th line to an m-th line to output a signal of a line output terminal line by line at a second frequency, wherein the second frequency is less than the first frequency;
at a first scanning output stage of the non-visuosensory area, enabling the shift registers of scanning lines before the n-th line to output the signal of the line output terminal line by line at the second frequency;
at a scanning transfer stage of the visuosensory area, enabling the shift registers from the n-th line to the m-th line to transfer the signal of the signal output terminal line by line at the first frequency; and
at a second scanning output stage of the non-visuosensory area, enabling shift registers of scanning lines after the m-th line to output the signal of the line output terminal line by line at the second frequency, wherein n is a natural number greater than or equal to 1, m is a natural number greater than n and less than or equal to N, and N is a total number of scanning lines.

12. The driving method according to claim 11, wherein the driving method comprises, during a reverse scanning:
at the scanning transfer stage of the non-visuosensory area, enabling the shift registers of scanning lines after the m-th line to transfer the signal of the signal output terminal line by line at the first frequency;
at the scanning output stage of the visuosensory area, enabling the shift registers from the m-th line to the n-th line to output the signal of the line output terminal line by line at the second frequency;
at the first scanning output stage of the non-visuosensory area, enabling the shift registers of scanning lines after the m-th line to output the signal of the line output terminal line by line at the second frequency;
at the scanning transfer stage of the visuosensory area, enabling the shift registers from the m-th line to the n-th line to transfer the signal of the signal output terminal line by line at the first frequency; and
at the second scanning output stage of the non-visuosensory area, enabling the shift registers of scanning lines before the n-th line to output the signal of the line output terminal line by line at the second frequency.

13. The driving method according to claim 12, wherein the driving method further comprises a scanning blank stage between the scanning output stage of the visuosensory area and the first scanning output stage of the non-visuosensory area and after the second scanning output stage of the non-visuosensory area, and wherein:
at the scanning blank stage, levels of pull-up nodes in all shift registers are pulled down to reset shift registers of all scanning lines.

14. The driving method according to claim 11, wherein the driving method further comprises a scanning blank stage between the scanning output stage of the visuosensory area and the first scanning output stage of the non-visuosensory area and after the second scanning output stage of the non-visuosensory area, and wherein:
at the scanning blank stage, levels of pull-up nodes in all shift registers are pulled down to reset shift registers of all scanning lines.

15. A driving method for a shift register, applied to the shift register according to claim 1, wherein the driving method comprises, during a forward scanning:
at the scanning output stage, providing, by the first output sub-circuit, the signal of the first power supply terminal to the pull-up node under the control of the signal input terminal, and outputting the signal of the first clock signal terminal to the signal output terminal according to the level of the pull-up node; outputting, by the second output sub-circuit, the signal of the signal output terminal to the line output terminal under the control of the line-ON enable signal; and transmitting, by the first output sub-circuit, the signal of the second clock signal terminal to the pull-down node under the control of the second clock signal terminal, and pulling down the level of the signal output terminal according to the level of the pull-down node; and
at the scanning transfer stage, providing, by the first output sub-circuit, the signal of the first power supply terminal to the pull-up node under the control of the signal input terminal, and outputting the signal of the first clock signal terminal to the signal output terminal according to the level of the pull-up node; pulling down, by the transfer sub-circuit, the signal of the line output terminal under the control of the line-OFF enable signal; and transmitting, by the first output sub-circuit, the signal of the second clock signal terminal to the pull-down node under the control of the second clock signal terminal, and pulling down the level of the signal output terminal according to the level of the pull-down node.

16. The driving method according to claim 15, wherein the driving method comprises, during a reverse scanning:
at the scanning transfer stage, providing, by the first output sub-circuit, the signal of the second power supply terminal to the pull-up node under the control of the reset terminal, and outputting the signal of the first clock signal terminal to the signal output terminal according to the level of the pull-up node; pulling down, by the transfer sub-circuit, the signal of the line output terminal under the control of the line-OFF enable signal; and transmitting, by the first output sub-circuit, the signal of the second clock signal terminal to the pull-down node under the control of the second clock signal terminal, and pulling down the level of the signal output terminal according to the level of the pull-down node; and at the scanning output stage, providing, by the first output sub-circuit, the signal of the second power supply terminal to the pull-up node under the control of the reset terminal, and outputting the signal of the first clock signal terminal to the signal output terminal according to the level of the pull-up node; outputting, by the second output sub-circuit, the signal of the signal output terminal to the line output terminal under the control of the line-ON enable signal;

transmitting, by the first output sub-circuit, the signal of the second clock signal terminal to the pull-down node under the control of the second clock signal terminal, and pulling down the level of the signal output terminal according to the level of the pull-down node.

17. A shift register, comprising: a first output sub-circuit, a second output sub-circuit and a transfer sub-circuit, wherein when a scanning line connected with the shift register is located in a visuosensory area with a plurality of scanning lines, working stages of the shift register comprises a visuosensory area scanning output stage and a visuosensory area scanning transfer stage; when the scanning line connected with the shift register is located in the non-visuosensory area with a plurality of scanning lines, working stages of the shift register comprises a non-visuosensory area scanning transfer stage and a non-visuosensory area scanning output stage; wherein the first output sub-circuit is configured to provide a signal of a first power supply terminal or a second power supply terminal to a pull-up node under control of a signal input terminal or a reset terminal, and output a signal of a first clock signal terminal to a signal output terminal according to a level of the pull-up node; transmit a signal of a second clock signal terminal to a pull-down node under control of the second clock signal terminal, and pull down a level of the signal output terminal according to a level of the pull-down node;

wherein the second output sub-circuit comprises a first transistor, a control electrode of the first transistor being connected with a line-ON enable terminal, a first electrode of the first transistor being connected with the signal output terminal, and a second electrode of the first transistor being connected with a line output terminal; and the second output sub-circuit is configured to, at a scanning output stage of the visuosensory area with the plurality of scanning lines and a scanning output stage of the non-visuosensory area with the plurality of scanning lines, a line-ON enable signal is output from the line-ON enable terminal, output a signal of the signal output terminal to the line output terminal under control of the line-ON enable signal; and wherein the transfer sub-circuit comprises a second transistor, a control electrode of the second transistor being connected with a line-OFF enable terminal, a first electrode of the second transistor being connected with a third power supply terminal, and a second electrode of the second transistor being connected with the line output terminal; and the transfer sub-circuit is configured to, at a scanning transfer stage of the visuosensory area with the plurality of scanning lines and a scanning transfer stage of the non-visuosensory area with the plurality of scanning lines, a line-OFF enable signal is output from the line-OFF enable terminal, pull down a level of the line output terminal under control of the line-OFF enable signal;

wherein the line output terminal is connected with a pixel line, and the signal output terminal is not connected with the pixel line, only transfer and reset of shift register is performed.

18. The shift register according to claim 17, wherein a frequency of an input signal of the first clock signal terminal and a frequency of an input signal of the second clock signal terminal of the first output sub-circuit at the visuosensory area scanning transfer stage and the non-visuosensory area scanning transfer stage are the same; a frequency of an input signal of the first clock signal terminal and a frequency of an input signal of the second clock signal terminal of the first output sub-circuit at the visuosensory area scanning output stage and the non-visuosensory area scanning output stage are the same, and the frequency of the input signal of the first clock signal terminal or the frequency of the input signal of the second clock signal terminal at the visuosensory area scanning output stage and the non-visuosensory area scanning output stage is less than the frequency of the input signal of the first clock signal terminal or the frequency of the input signal of the second clock signal terminal at the visuosensory area scanning transfer stage and the non-visuosensory area scanning transfer stage.

19. The shift register according to claim 17, wherein the first output sub-circuit comprises an intermediate output sub-circuit, the intermediate output sub-circuit being configured to output the signal of the first clock signal terminal to the signal output terminal according to the level of the pull-up node;

wherein the intermediate output sub-circuit comprises a fifth transistor and a first capacitor, wherein:
a control electrode of the fifth transistor is connected with the pull-up node, a first electrode of the fifth transistor is connected with the first clock signal terminal, and a second electrode of the fifth transistor is connected with the signal output terminal;
one terminal of the first capacitor is connected with the pull-up node, and the other terminal of the first capacitor is connected with the signal output terminal.

20. The shift register according to claim 19, wherein the first output sub-circuit further comprises an input sub-circuit, a first reset sub-circuit, a pull-down sub-circuit, a pull-down control sub-circuit, and a second reset sub-circuit, and wherein:
the input sub-circuit is configured to provide the signal of the first power supply terminal to the pull-up node under control of the signal input terminal;
the first reset sub-circuit is configured to provide the signal of the second power supply terminal to the pull-up node under control of the reset terminal;
the pull-down control sub-circuit is configured to pull down the level of the pull-down node according to the level of the pull-up node; transmit the signal of the second clock signal terminal to the pull-down node under control of the second clock signal terminal, and pull down the level of the pull-up node according to the level of the pull-down node;
the pull-down sub-circuit is configured to pull down the level of the pull-down node according to the level of the signal output terminal; pull down the level of the signal output terminal according to the level of the pull-down node; and the second reset sub-circuit is configured to reset the pull-up node under control of a total reset terminal.

\* \* \* \* \*